United States Patent
Yu et al.

(10) Patent No.: US 11,594,602 B2
(45) Date of Patent: Feb. 28, 2023

(54) BUTTED CONTACTS AND METHODS OF FABRICATING THE SAME IN SEMICONDUCTOR DEVICES

(71) Applicant: Taiwan Semiconductor Manufacturing Co., Ltd., Hsin-Chu (TW)

(72) Inventors: Li-Zhen Yu, New Taipei (TW); Lin-Yu Huang, Hsinchu (TW); Cheng-Chi Chuang, New Taipei (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 22 days.

(21) Appl. No.: 16/850,267

(22) Filed: Apr. 16, 2020

(65) Prior Publication Data
US 2021/0328032 A1     Oct. 21, 2021

(51) Int. Cl.
| | | |
|---|---|---|
| *H01L 29/417* | (2006.01) | |
| *H01L 29/49* | (2006.01) | |
| *H01L 29/78* | (2006.01) | |
| *H01L 29/66* | (2006.01) | |
| *H01L 21/285* | (2006.01) | |
| *H01L 21/321* | (2006.01) | |
| *H01L 21/8234* | (2006.01) | |
| *H01L 23/528* | (2006.01) | |
| *H01L 23/535* | (2006.01) | |

(52) U.S. Cl.
CPC .. *H01L 29/41791* (2013.01); *H01L 21/28568* (2013.01); *H01L 21/3212* (2013.01); *H01L 21/823475* (2013.01); *H01L 23/5283* (2013.01); *H01L 23/535* (2013.01); *H01L 29/4983* (2013.01); *H01L 29/6653* (2013.01); *H01L 29/66795* (2013.01); *H01L 29/7851* (2013.01)

(58) Field of Classification Search
CPC ....... H01L 29/41791; H01L 21/823475; H01L 23/5283; H01L 23/535
See application file for complete search history.

(56) References Cited

U.S. PATENT DOCUMENTS

| | | | |
|---|---|---|---|
| 10,236,215 B1 * | 3/2019 | Xie | ............ H01L 27/0886 |
| 10,326,002 B1 | 6/2019 | Zhang et al. | |
| 2015/0340467 A1 | 11/2015 | Bouche et al. | |
| 2017/0221891 A1 * | 8/2017 | Chen | ............ H01L 23/485 |
| 2017/0330834 A1 | 11/2017 | Basker et al. | |
| 2019/0385946 A1 | 12/2019 | Xie et al. | |

FOREIGN PATENT DOCUMENTS

KR      20190124417 A      11/2019

* cited by examiner

*Primary Examiner* — Farun Lu
(74) *Attorney, Agent, or Firm* — Haynes and Boone, LLP

(57) ABSTRACT

A semiconductor structure includes a metal gate structure (MG) formed over a substrate, a first gate spacer formed on a first sidewall of the MG, a second gate spacer formed on a second sidewall of the MG opposite to the first sidewall, where the second gate spacer is shorter than the first gate spacer, a source/drain (S/D) contact (MD) adjacent to the MG, where a sidewall of the MD is defined by the second gate spacer, and a contact feature configured to electrically connect the MG to the MD.

20 Claims, 36 Drawing Sheets

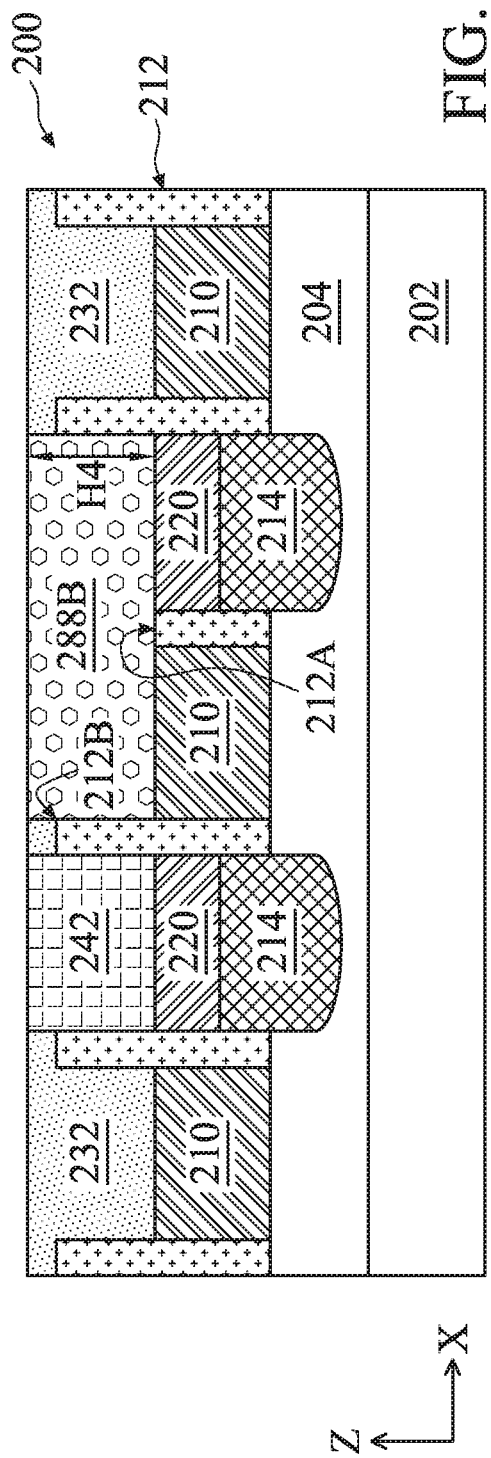
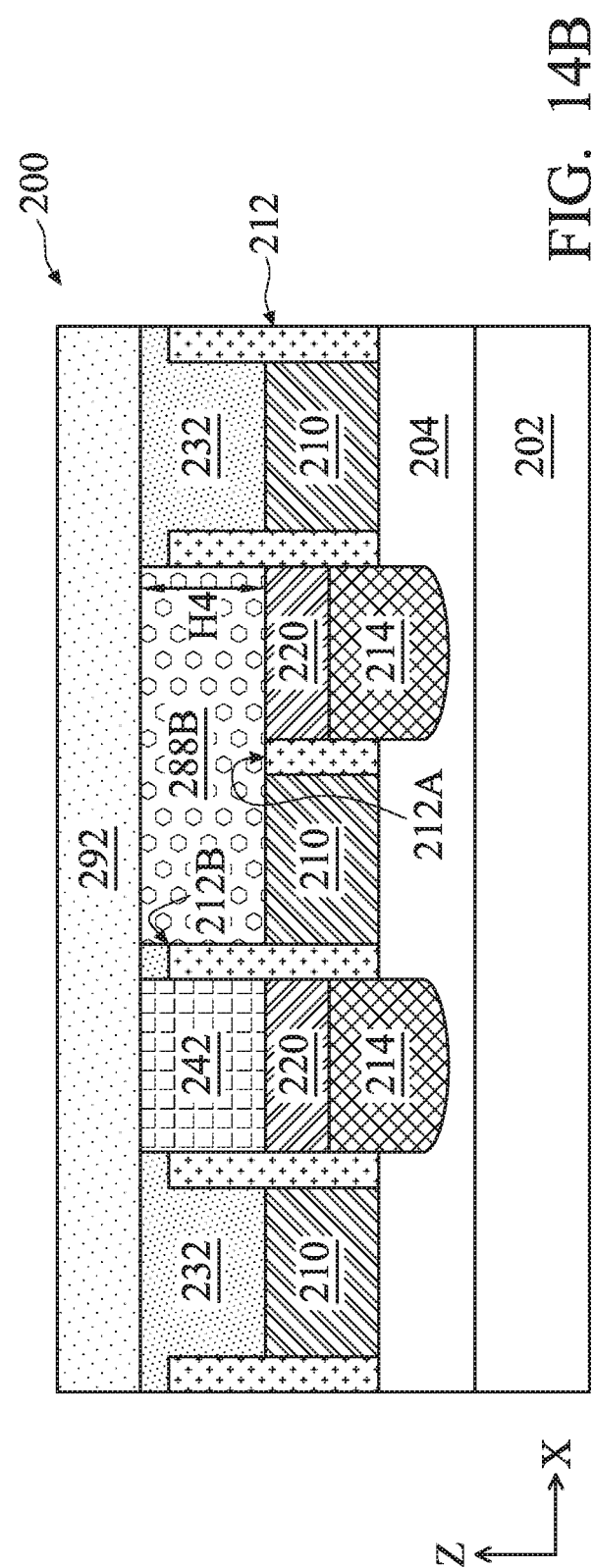

BUTTED CONTACTS AND METHODS OF FABRICATING THE SAME IN SEMICONDUCTOR DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, in memory devices (e.g., static random-access memory, or SRAM, devices), fabrication of butted contacts and interconnect features becomes more challenging as feature sizes continue to decrease. At smaller length scales, configurations of a butted contact may be altered to improve connection between a metal gate structure and a neighboring source/drain contact. Additionally, interconnect features formed over a butted contact may benefit from enlarged contact area in an effort to reduce contact resistance and to improve device density. For at least these reasons, improvements in fabricating butted contacts and interconnect features are desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9, 10, 11A, 11B, 11C, 11D, 11E, 11F, 11G, 12B, 13A, 13B, 13C, 13D, 13E, 13F, 13G, 14A, 14B, 15A, 15B, 15C, 15D, 16A, 16B, 16C, 16D, 16E, 16F, and 16G are cross-sectional views of an embodiment of the semiconductor device of FIG. 2A and/or FIG. 2B along line MM' during intermediate steps of an embodiment of the method of FIG. 1 according to various aspects of the present disclosure.

DETAILED DESCRIPTION

Figure 1:
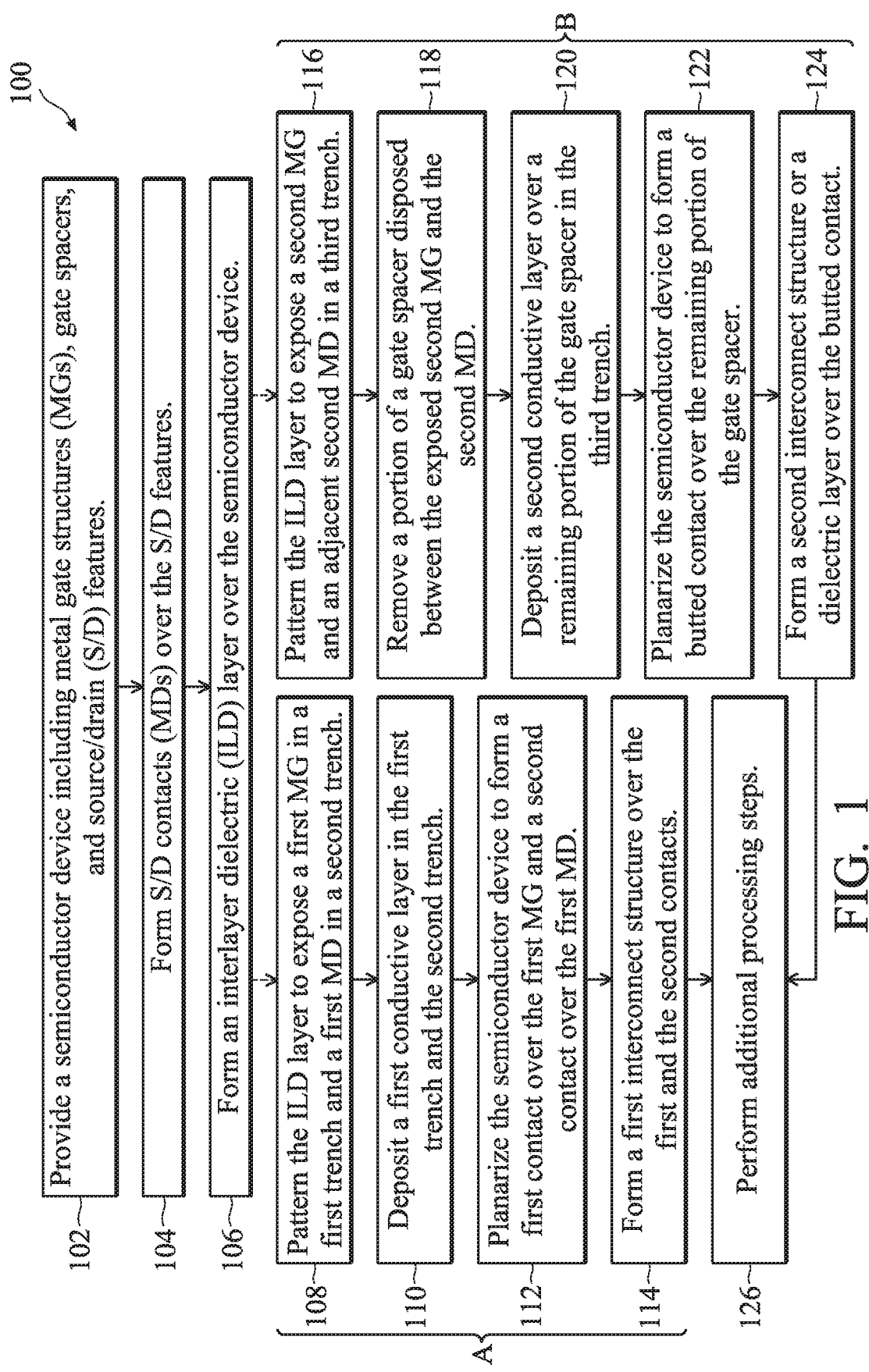
FIG. 1 shows a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as planar FETs, three-dimensional fin-like FETs (FinFETs), gate-all-around (GAA) FETs, or combinations thereof. Some embodiments of the present disclosure may be directed to memory devices, such as SRAM devices, in an IC.

In FET fabrication, a butted contact is configured to electrically couple a metal gate structure (e.g., a high-k metal gate structure, or HKMG) to a source/drain (S/D) contact. To ensure proper device performance, a subsequently-formed interconnect feature (e.g., a conductive line) over the butted contact is designed to be isolated from the butted contact to avoid electrical shorting between the two features, which may limit one or more dimensions of the interconnect feature as seen from a planar top view. Though existing methods of fabricating butted contacts and interconnect features have been generally adequate, they have not been entirely satisfactory in all aspects. In one example, the need to reduce dimension of the butted contact to avoid shorting may compromise connection between the metal gate structure and the S/D contact. In another example, accommodating the separation distance between the butted contact and the interconnect feature formed thereover may become challenging at small length scales. In yet another example, interconnect features with reduced dimensions may inadvertently increase contact resistance of such features and unnecessarily limit the performance of the device.

Figure 2A:
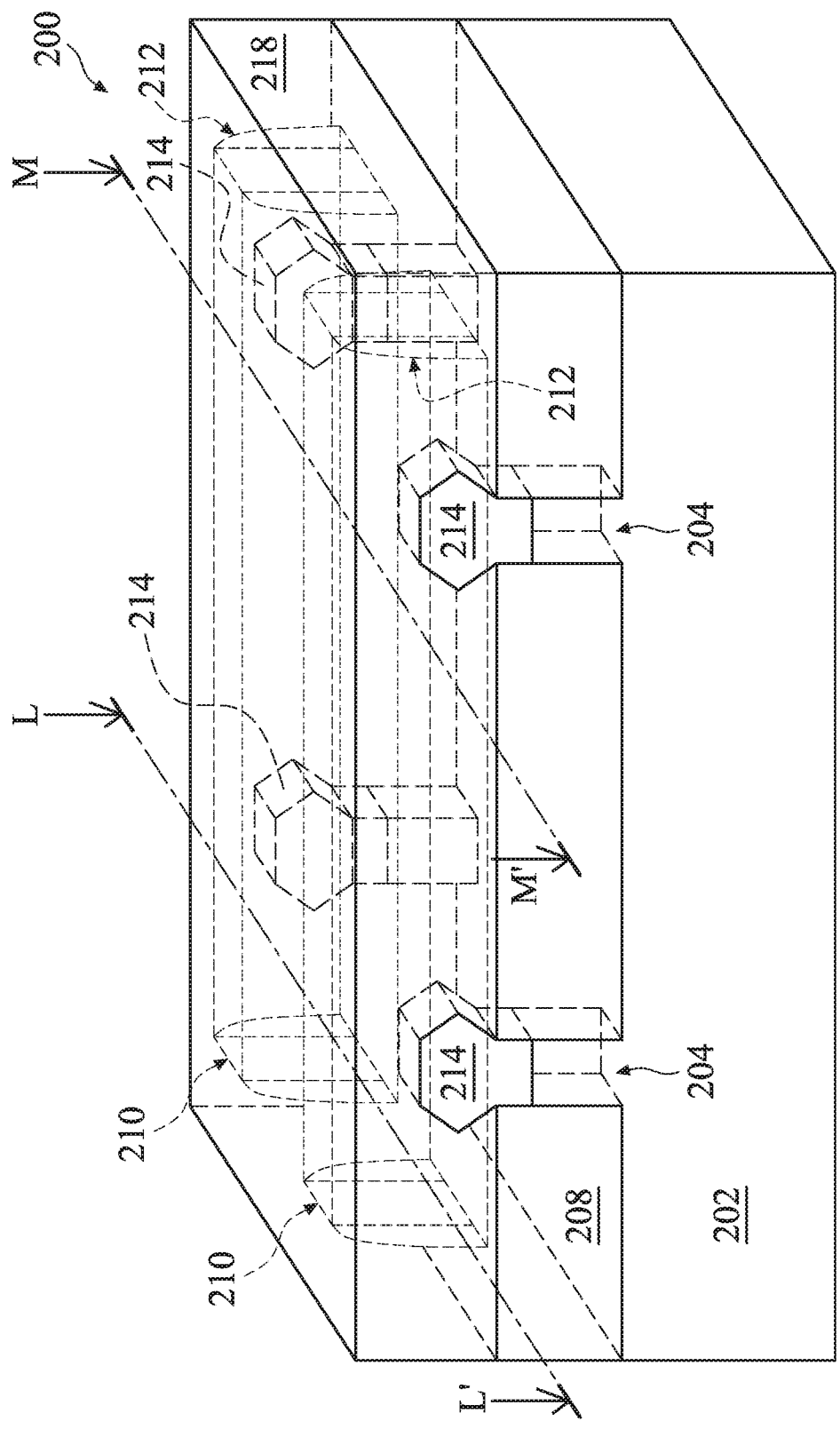
FIG. 2A is a perspective three-dimensional view of an embodiment of a semiconductor device according to various aspects of the present disclosure.
Figure 2B:
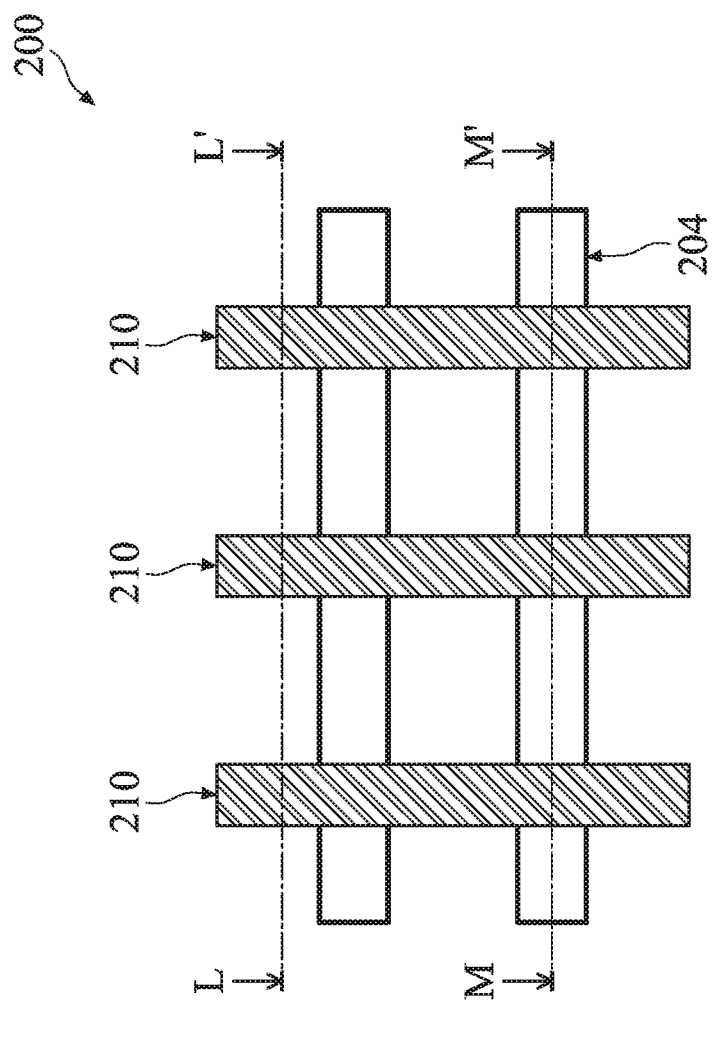
FIG. 2B is a planar top view of an embodiment of a semiconductor device according to various aspects of the present disclosure.

FIG. 1 illustrates an embodiment of a method 100 for forming a semiconductor device 200 according to various aspects of the present disclosure. The method 100 is merely an example and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2A-17B, which illustrate a portion of the semiconductor device 200 during intermediate steps of the method 100, of which FIG. 2A is a three-dimensional perspective view of the device 200; FIGS. 2B, 17A, and 17B are planar top views of the device 200 as illustrated in FIG. 2A; FIGS. 3-12B are cross-sectional views of the device 200 taken along dashed line LL' as illustrated in FIGS. 2A, 2B, 17A, and/or 17B; and FIGS. 13A-16G are cross-sectional views of the device 200 taken along dashed line MM' as illustrated in FIGS. 2A, 2B, 17A, and/or 17B.

The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, GAA FETs, metal-oxide semiconductor field effect transistors (MOSFETs), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 3:
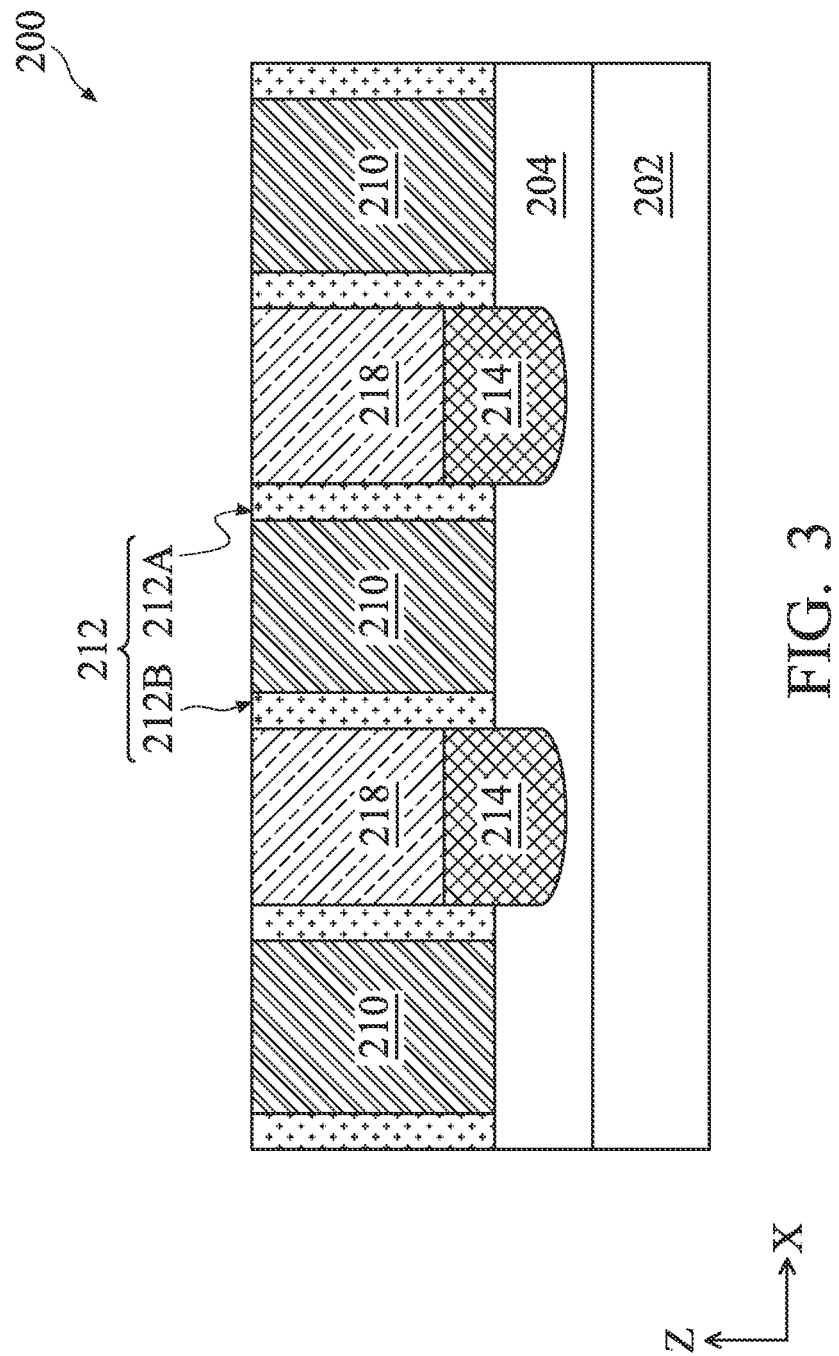

At operation 102, referring to FIGS. 2A, 2B, and 3, the method 100 provides a device 200 including a substrate 202 having three-dimensional active regions 204 (hereafter referred to as fins 204) disposed thereover. The device 200 further includes high-k metal gate (HKMG) structures 210 disposed over the fins 204, gate spacers 212 disposed on sidewalls of the HKMG structures 210, S/D features 214 disposed in or over each fin 204, isolation structures 208 disposed over the substrate 202 separating various components of the device 200, and an interlayer dielectric (ILD) layer 218 disposed over the isolation structures 208 and the S/D features 214. It is noted that though two HKMG structures 210 are depicted in the three-dimensional perspective view of FIG. 2A, additional HKMG structure(s) 210 may be present in the device 200, such as those depicted in FIGS. 2B-17B.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions are formed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, other suitable techniques, or combinations thereof.

Still referring to FIGS. 2A, 2B, and 3, the fins 204 may be suitable for forming a p-type or an n-type FinFET. The fin 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), other suitable processes, or combinations thereof.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204.

The isolation structures 208 may include silicon oxide, silicon nitride, silicon oxynitride, fluoride-doped silicate glass (FSG), a low-k dielectric material, other suitable materials, or combinations thereof. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization/polishing (CMP) process. Other isolation structures such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Referring to FIG. 2A, the device 200 includes S/D features 214 disposed over the fins 204 and adjacent to the HKMG structures 210. The S/D features 214 may be formed by any suitable techniques, such as etching processes followed by one or more epitaxy processes. In one example, one or more etching processes are performed to remove portions of the fins 204 to form recesses (not shown) therein, respectively. A cleaning process may be performed to clean the recesses with a hydrofluoric acid (HF) solution and/or other suitable solutions. Subsequently, one or more epitaxial growth processes are performed to grow epitaxial features in the recesses. Each of the S/D features 214 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe) doped with a p-type dopant such as boron, gallium, indium, and/or other p-type dopants. The n-type epitaxial material may include one or more epitaxial layers of silicon (epi Si) or silicon carbon (epi SiC) doped with an n-type dopant such as arsenic, phosphorus, and/or other n-type dopant.

Still referring to FIGS. 2A, 2B, and 3, the device 200 further includes at least one HKMG structure 210 disposed over a portion of the fins 204, such that each HKMG structure 210 is interposed between the S/D features 214 formed in each fin 204. The HKMG structure 210 may include a high-k dielectric layer (i.e., having a dielectric constant greater than that of silicon oxide; not depicted) disposed over the fins 204 and a metal gate electrode (not depicted) disposed over the high-k dielectric layer. The metal gate electrode may further include, though not depicted herein, at least one work function metal layer and a bulk conductive layer disposed thereover. The work function metal layer may be a p-type or an n-type work function metal layer. Example work function materials include TiN, TaN, $ZrSi_2$, $MoSi_2$, $TaSi_2$, $NiSi_2$, Ti, Ag, TaAl, TaAlC, TiAlN, TaC, TaCN, TaSiN, Ru, Mo, Al, WN, Mn, Zr, other suitable work function materials, or combinations thereof. The bulk conductive layer may include Cu, W, Ru, Al, Co, other suitable materials, or combinations thereof. The HKMG structure 210 may further include other layers (not depicted), such as an interfacial layer disposed between the fins 204 and the high-k dielectric layer, hard mask layers, capping layers, barrier layers, seed layers, other suitable layers, or combinations thereof. Various layers of the HKMG structure 210 may be deposited by any suitable method, such as chemical oxidation, thermal oxidation, atomic layer deposition (ALD), CVD, physical vapor deposition (PVD), plating, other suitable methods, or combinations thereof. A polishing process, such as CMP, may be performed to remove excess materials from a top surface of the HKMG structure 210 to planarize the device 200.

The device 200 further includes gate spacers 212 disposed on sidewalls of each HKMG structure 210. The gate spacers 212 may be a single-layer structure or a multi-layer structure. The gate spacers 212 may include aluminum oxide, aluminum oxynitride, hafnium oxide, titanium oxide, zirconium aluminum oxide, zinc oxide, tantalum oxide, lanthanum oxide, yttrium oxide, silicon oxycarbonitride, tantalum carbonitride, silicon nitride, zirconium nitride, silicon carbonitride, silicon oxide, silicon oxycarbide, hafnium silicide, silicon, zirconium silicide, other suitable materials, or combinations thereof. Notably, the composition of the gate spacers 212 is distinct from that of the surrounding dielectric components, such that an etching selectivity exists between the gate spacers 212 and the surrounding dielectric components during subsequent etching processes. The gate spacers 212 may be formed by first depositing a blanket of spacer material over the device 200, and then performing an anisotropic etching process to remove portions of the spacer material to form the gate spacers 212 on sidewalls of the HKMG structure 210.

In some embodiments, the HKMG structures 210 are formed after other components of the device 200 (e.g., the S/D features 214) are fabricated. Such process is generally referred to as a gate replacement process, which includes forming a dummy gate structure (not depicted) as a placeholder for each HKMG structure 210, forming the S/D features 214 adjacent to the dummy gate structure, forming the ILD layer 218 over the dummy gate structure and the S/D features 214, planarizing the ILD layer 218 by, for example, CMP, to expose a top surface of the dummy gate structure, removing the dummy gate structure in the ILD layer 218 to form a gate trench (not depicted) that exposes a channel region of the fins 204, and forming the HKMG structure 210 in the gate trench to complete the gate replacement process. In some embodiments, the ILD layer 218 includes a dielectric material, such as a low-k dielectric material, tetraethylorthosilicate (TEOS), silicon oxide, doped silicon oxide such as borophosphosilicate glass (BPSG), fluoride-doped silicate glass (FSG), phosphosilicate glass (PSG), boron doped silicon glass (BSG), other suitable dielectric materials, or combinations thereof. The ILD layer 218 may include a multi-layer structure having multiple dielectric materials and may be formed by a deposition process such as, for example, CVD, FCVD, SOG, other suitable methods, or combinations thereof.

Figure 4:
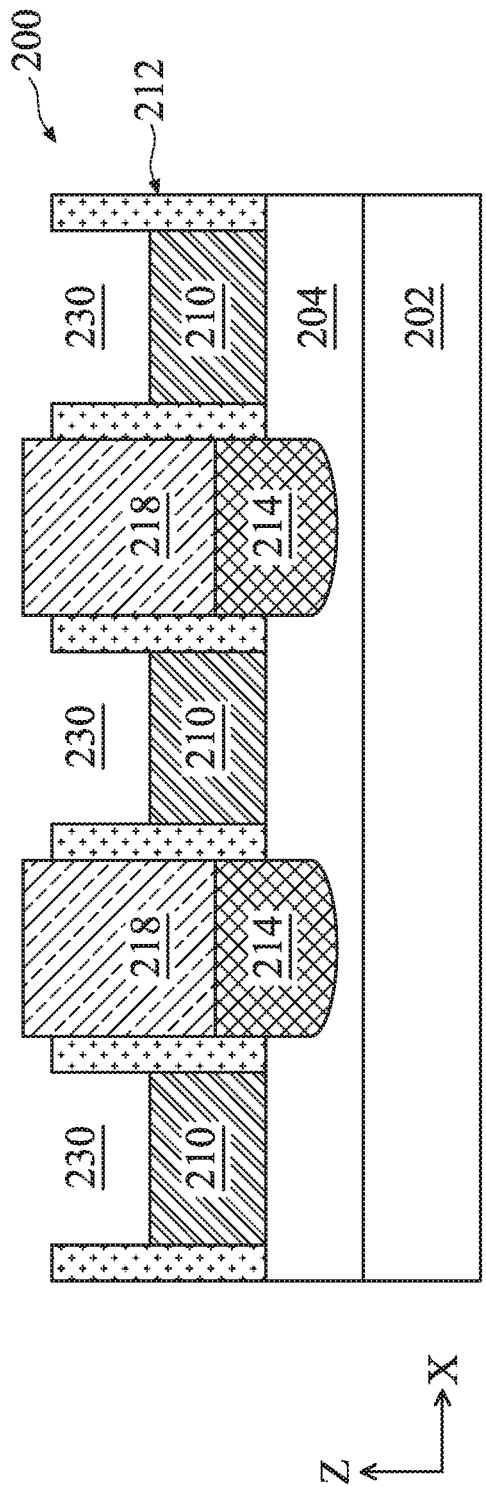
Figure 5:
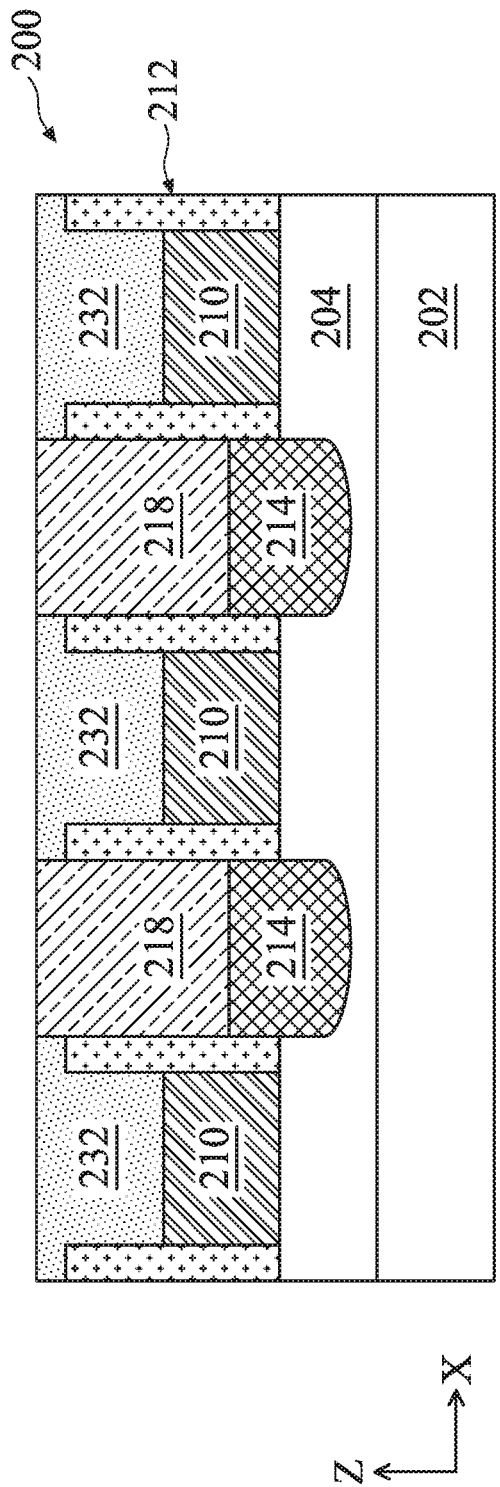

Referring to FIGS. 4 and 5, the method 100 at operation 104 forms a dielectric layer 232 over the HKMG structures 210. Referring to FIG. 4, the method 100 first removes portions of the HKMG structures 210 to form trenches 230. In some embodiments, the method 100 performs an etching process, such as a dry etching process, to form the trenches 230. The etching process selectively removes the HKMG structures 210 with respect to the ILD layer 218, such that the ILD layer 218 is not etched or only minimally etched. Referring to FIG. 5, the method 100 then forms the dielectric layer 232 in the trenches 230. In the present embodiments, the method 100 deposits a dielectric material by a suitable method, such as CVD, FCVD, ALD, PVD, other suitable methods, or combinations thereof. The dielectric layer 232 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, other suitable materials, or combinations thereof. Thereafter, the method 100 planarizes a top surface of the device 200 using a suitable method such as CMP to expose a top surface of the ILD layer 218. In some embodiments, as depicted in FIG. 5, the CMP process results in a top surface of the dielectric layer 232 being substantially planar with a top surface of the ILD layer 218 and the gate spacers 212. In some embodiments, the dielectric layer 232 and the subsequently-formed dielectric layer 242 are optional and may be omitted in the device 200.

Figure 6:
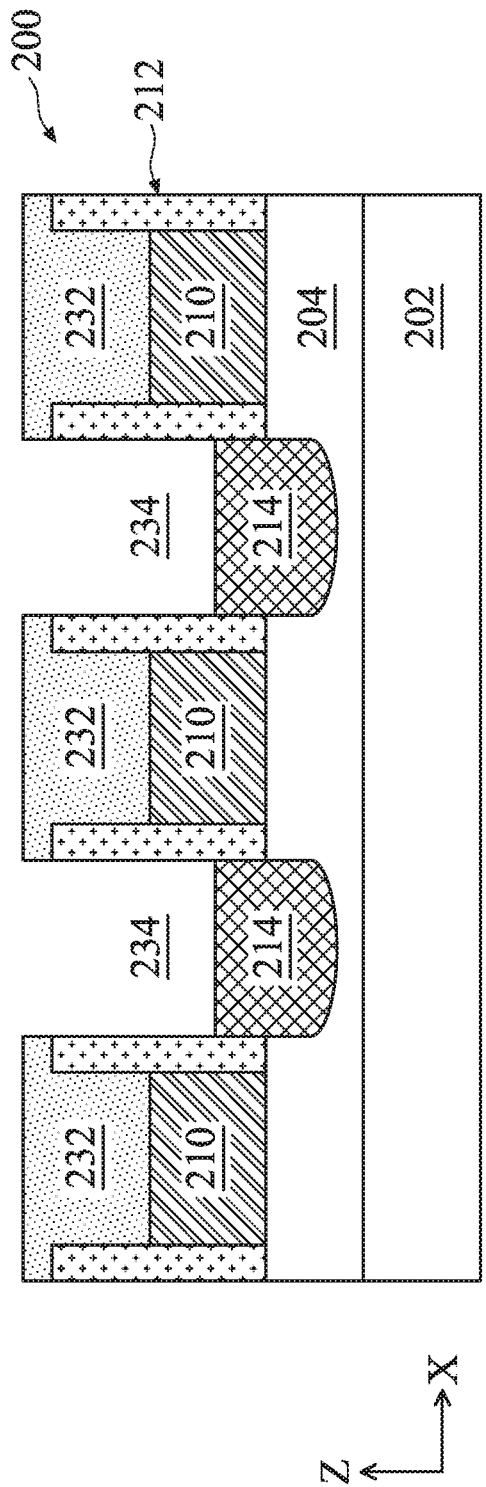
Figure 7:
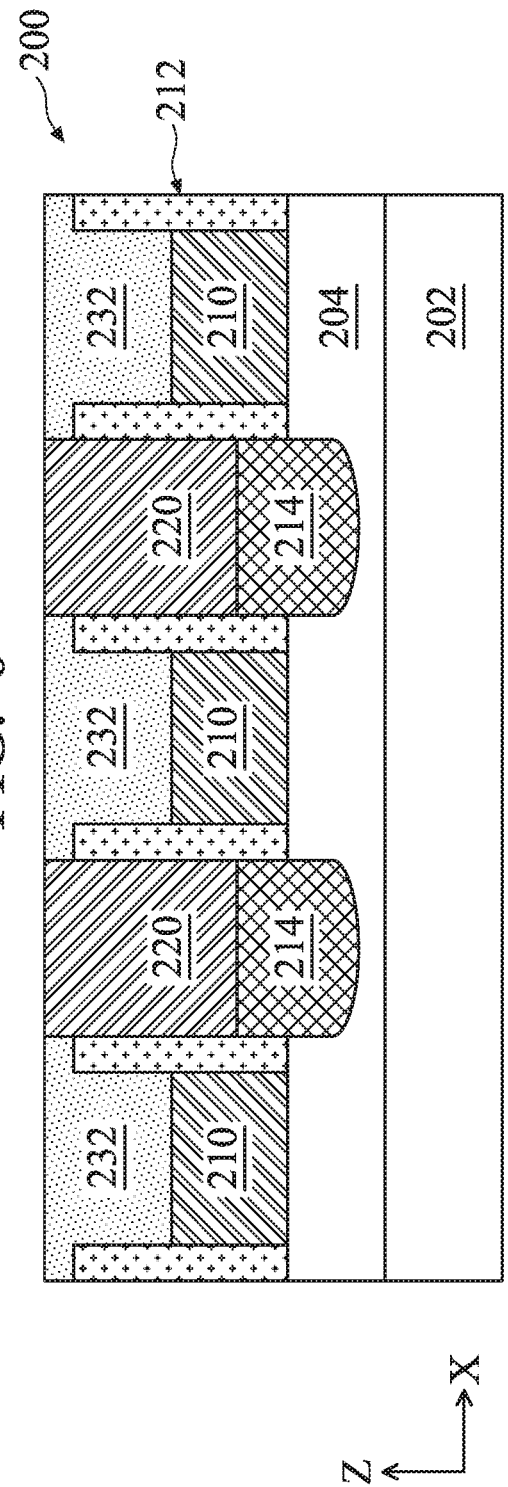

Referring to FIGS. 6 and 7, the method 100 at operation 104 forms S/D contacts 220 over the S/D features 214. Referring to FIG. 6, the method 100 removes portions of the ILD layer 218 disposed over the S/D features 214 to form trenches 234. The method 100 may implement any suitable etching process (e.g., dry etching, wet etching, RIE, etc.) to form the trenches 234. In some embodiments, the etching process is a dry etching process that employs one or more plasma, such as $C_4F_6$, oxygen, hydrogen, other suitable gases, or combinations thereof. Referring to FIG. 7, the method 100 then deposits a conductive material in the trenches 234 and over portions of the dielectric layer 232. The conductive material may include Co, W, Ru, Cu, Ta, Ti, Mo, Ni, other suitable materials, or combinations thereof.

The conductive material may be deposited by any suitable method, such as CVD, PVD, ALD, plating, other suitable methods, or combinations thereof. In some embodiments, a barrier layer (not depicted) is formed in the trenches 234 before depositing the conductive material. The barrier layer may include TiN, TaN, other suitable materials, or combinations thereof, and may be deposited by, for example, an ALD process. Thereafter, still referring to FIG. 7, the method 100 planarizes the conductive material using a suitable method such as CMP to form the S/D contacts 220 over the S/D features 214. In some embodiments, portions of the conductive material formed over the dielectric layer 232 are removed by the CMP process, such that a top surface of the S/D contacts are substantially planar with a top surface of the dielectric layer 232.

Figure 8:
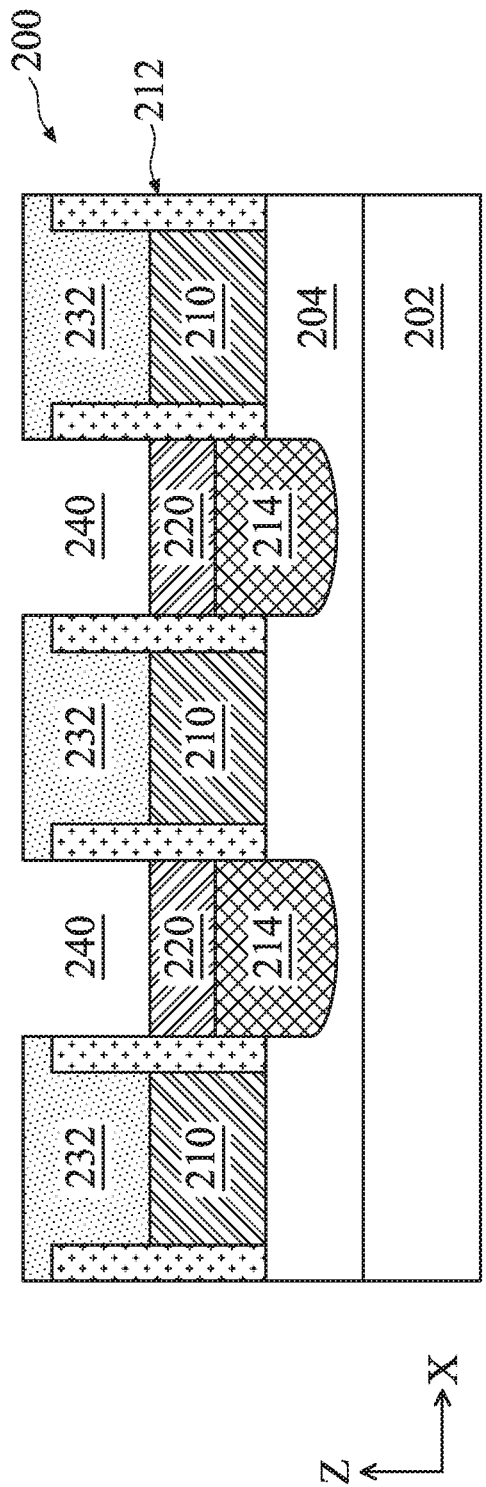
Figure 9:
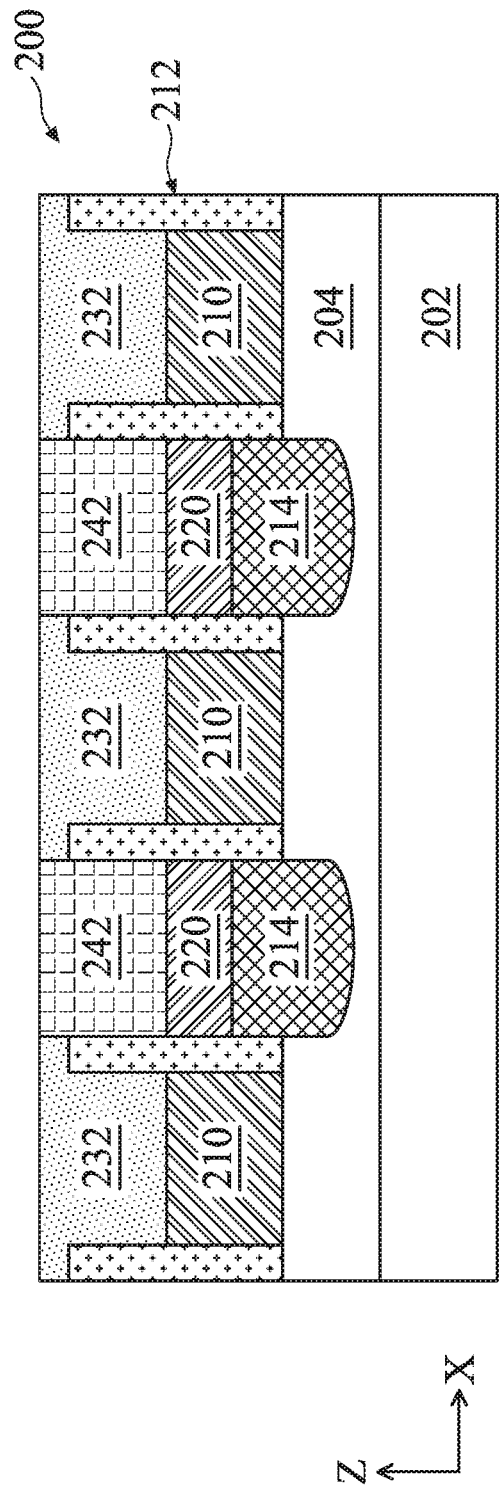

Referring to FIGS. 8 and 9, the method 100 forms a dielectric layer 242 over the dielectric layer 232 and the HKMG structures 210. In some embodiments, referring to FIG. 8, the method 100 first removes portions of the S/D contacts 220 to form trenches 240, which are disposed between the gate spacers 212. The method 100 may implement any suitable etching process (e.g., dry etching, wet etching, RIE, etc.) to form the trenches 240. In the present disclosure, the etching process may be a wet etching process that employs a mixture of acid, such as sulfuric acid ($H_2SO_4$), as an etchant. In some embodiments, the wet etching process is controlled by the duration of the etching process. Referring to FIG. 9, the method 100 then deposits a dielectric layer 242 in the trenches 240 and over portions of the dielectric layer 232 using any suitable method, such as CVD, FCVD, ALD, PVD, other suitable methods, or combinations thereof. The dielectric layer 242 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, other suitable materials, or combinations thereof. Notably, in the present disclosure, the dielectric layer 242 has a composition different from that of the dielectric layer 232, such that they would exhibit etching selectivity when subjected to a subsequent etching process as will be discussed in detail below. Thereafter, still referring to FIG. 9, the method 100 planarizes the top surface of the device 200 to expose the top surface of the dielectric layer 232 and the gate spacers 212, such that a top surface of the dielectric layer 242 is substantially planar with the top surface of the dielectric layer 232.

Figure 10:
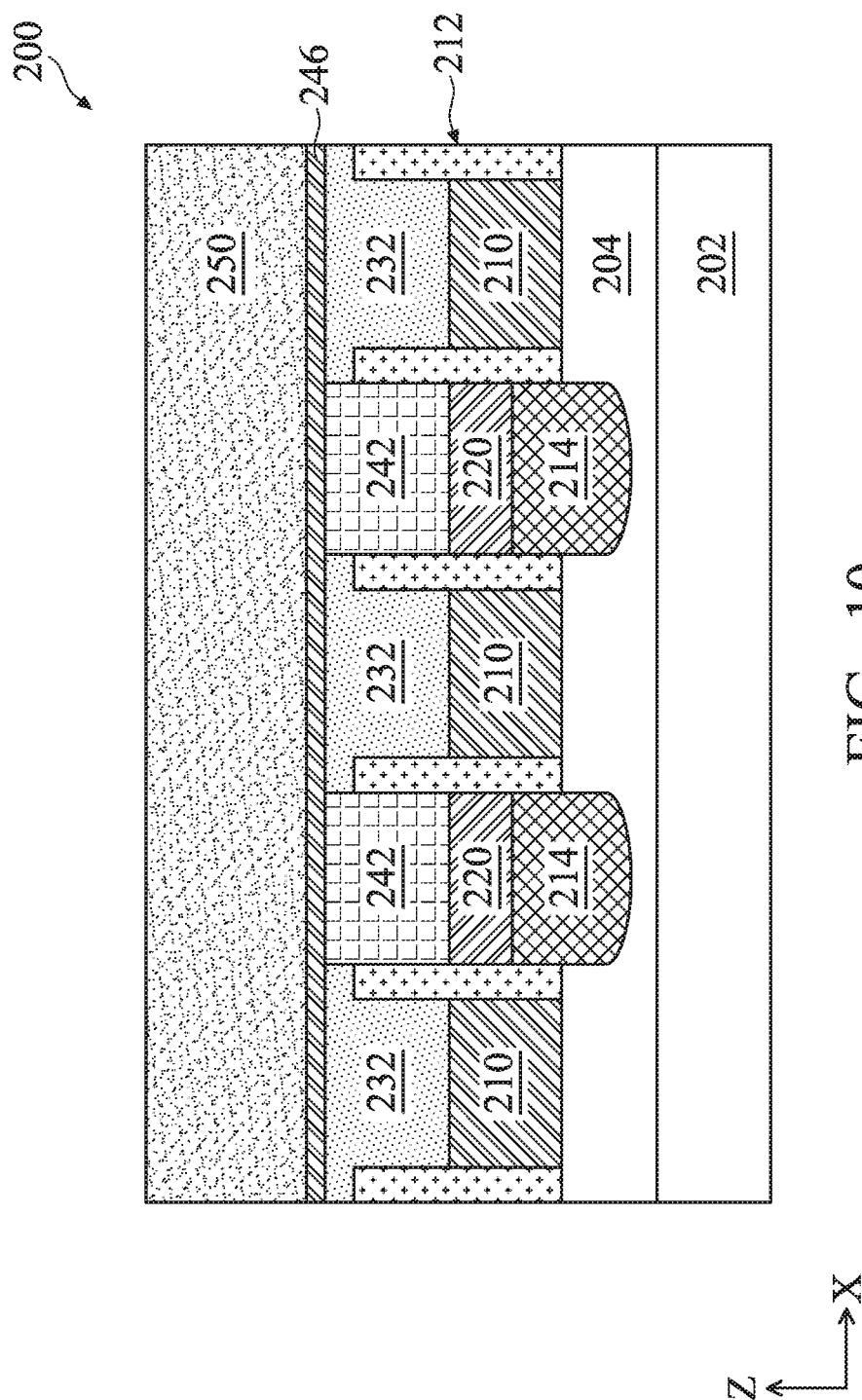

Referring to FIG. 10, the method 100 at operation 106 forms an ESL 246 over the device 200 and subsequently forms an ILD layer 250 (may be also referred to as an intermetal dielectric, or IMD, layer) over the ESL 246. The ESL 246 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, other suitable materials, or combinations thereof. In some embodiments, the method 100 deposits the ESL 246 using any suitable method, such as CVD, ALD, other suitable methods, or combinations thereof. The ILD layer 250 may be similar to the ILD layer 218 and may be formed in similar manners as those discussed above with respect to the ILD layer 218. Thereafter, the method 100 may proceed to form an interconnect structure over the ILD layer 250 that includes vertical interconnect features (hereafter referred to as vias) configured to interconnect the HKMG structures 210 and the S/D contacts 220 with additional interconnect features, such as horizontal interconnect features (hereafter referred to as conductive lines), and/or with a butted contact (BCT) configured to connect a HKMG structure 210 with an S/D contact 220 of the same transistor.

Referring back to FIG. 1, Pathway A including operations 108-114 generally depicts a process flow of forming vias for interconnecting an HKMG structure 210 and an S/D contact 220, and Pathway B including operations 116-124 generally depicts a process flow of forming a BCT connecting an HKMG structure 210 to an S/D contact 220 of the same transistor (e.g., a memory device). In the present embodiments, Pathway A will be discussed in reference to cross-sectional views of the device 200 taken along line LL' and the Pathway B will be discussed in reference to cross-sectional views of the device 200 taken along line MM', respectively, as depicted in FIGS. 2A, 2B, 17A, and/or 17B.

Figure 11A:
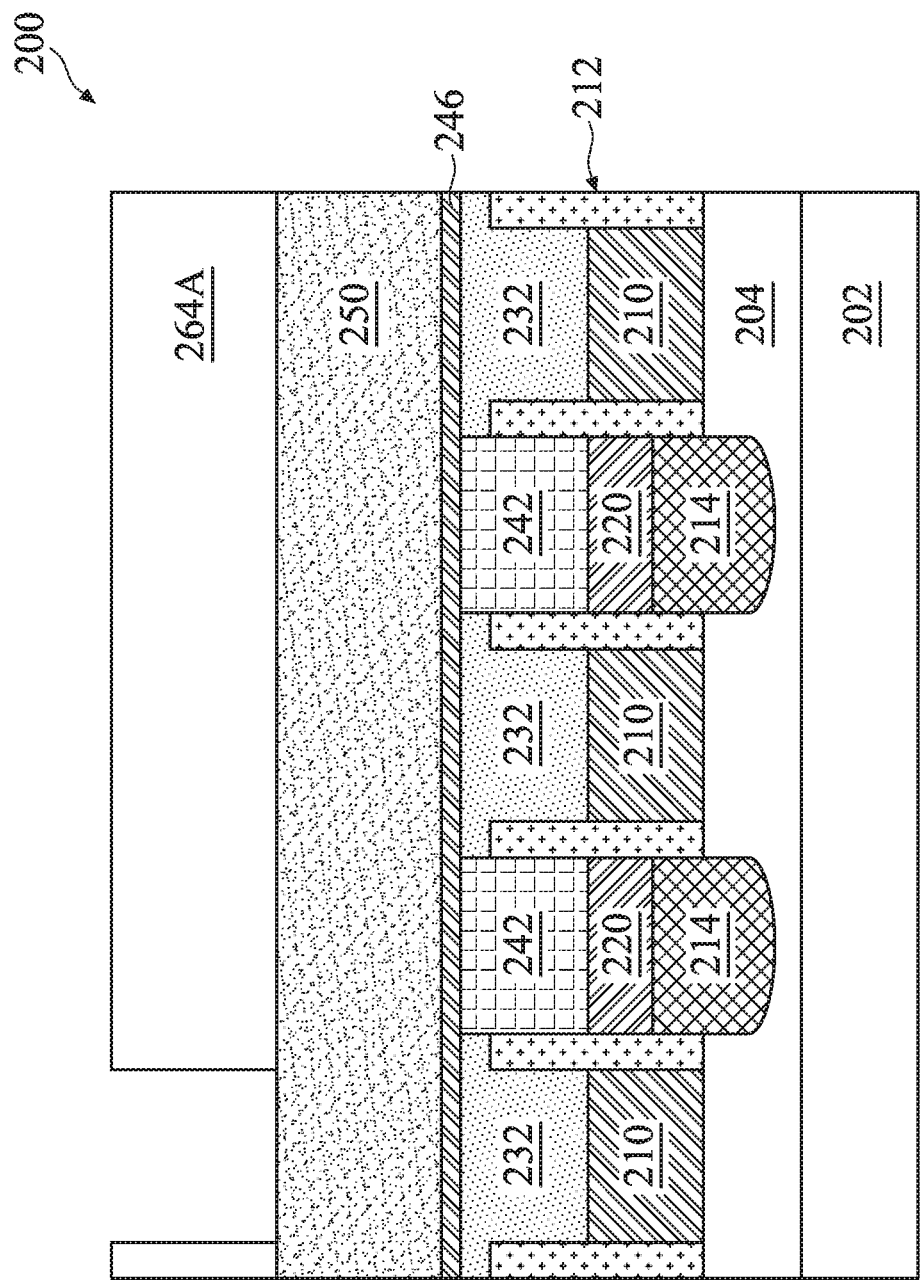
Figure 11B:
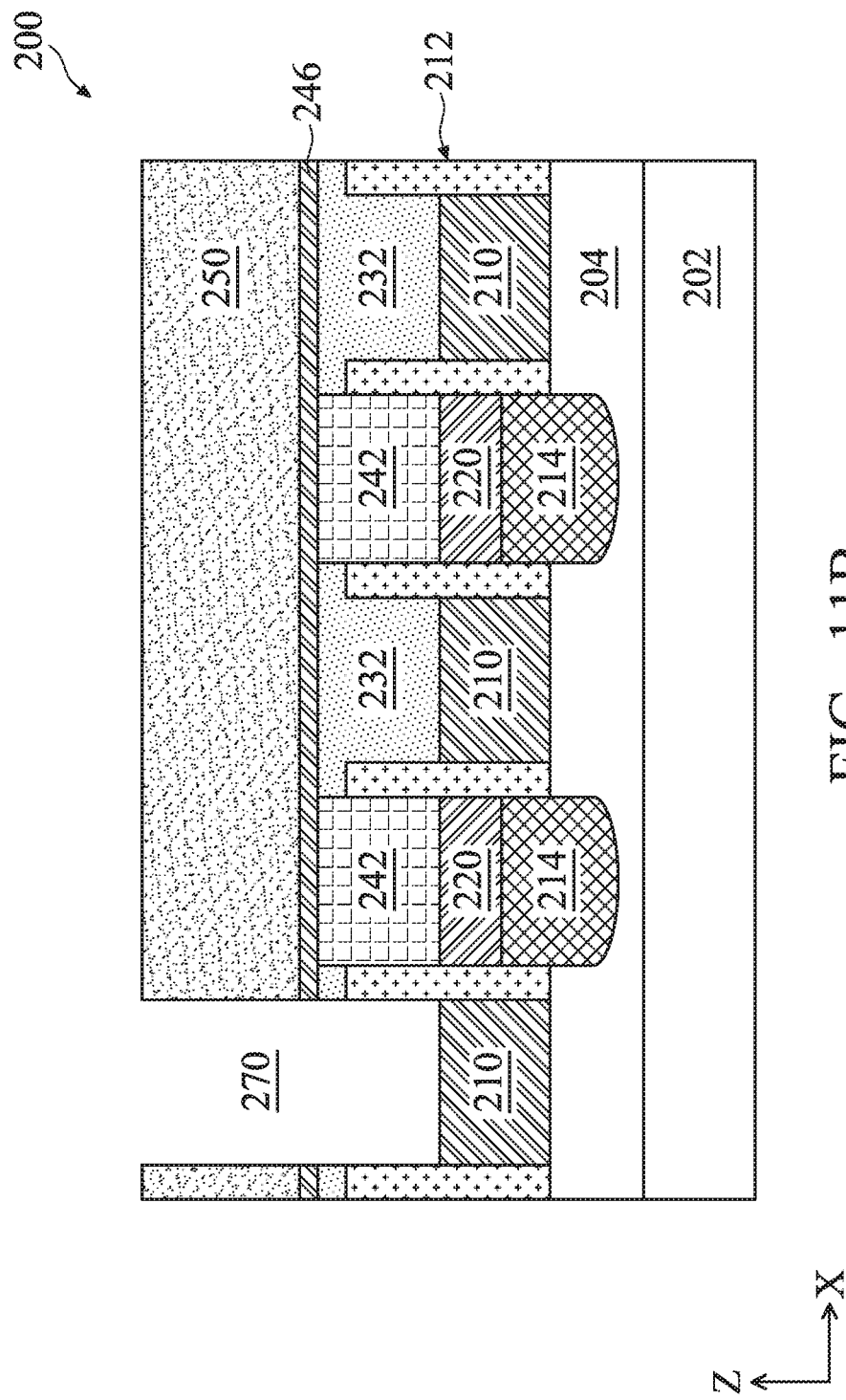

With regard to Pathway A and referring to FIGS. 11A-11D, the method 100 at operation 108 patterns portions of the device 200 to expose one of the HKMG structures 210 in a trench 270 and one of the S/D contacts 220 in a trench 272. In some embodiments, as depicted herein, the exposed HKMG structure 210 and the exposed S/D contact 220 belong to separate transistors. Referring to FIGS. 11A and 11B, the method 100 first forms the trench 270 by implementing a series of patterning and etching processes. For example, referring to FIG. 11A, the method 100 first forms a patterned masking element 264A over the ILD layer 250 by exposing the masking element 264A to a radiation source (e.g., extreme ultraviolet, or EUV, source) through a patterned photomask and subsequently developing the exposed masking element 264A to form the patterned masking element 264A that includes an opening corresponding to the trench 270. In some embodiments, the patterned masking element 264A includes at least a photoresist layer (not depicted) disposed over one or more material layers. In one such example, the patterned masking element 264A may be of a tri-layer structure including a photoresist layer disposed over a middle layer, which is disposed over an anti-reflective bottom layer. In addition, though not depicted, one or more hard mask layers may be formed between the patterned masking element 264A and the ILD layer 250 to accommodate any subsequent etching processes. Referring to FIG. 11B, using the patterned masking element 264A as an etch mask, the method 100 then removes portions of the ILD layer 250, the ESL 246, and the dielectric layer 232 to expose the HKMG structure 210 in the trench 270. The method 100 may remove portions of the ILD layer 250, the ESL 246, and the dielectric layer 232 in one or more etching processes, such as a dry etching process and/or an RIE process. Thereafter, the patterned masking element 264A is removed from the device 200 by a suitable method, such as resist stripping and/or plasma ashing.

Figure 11C:
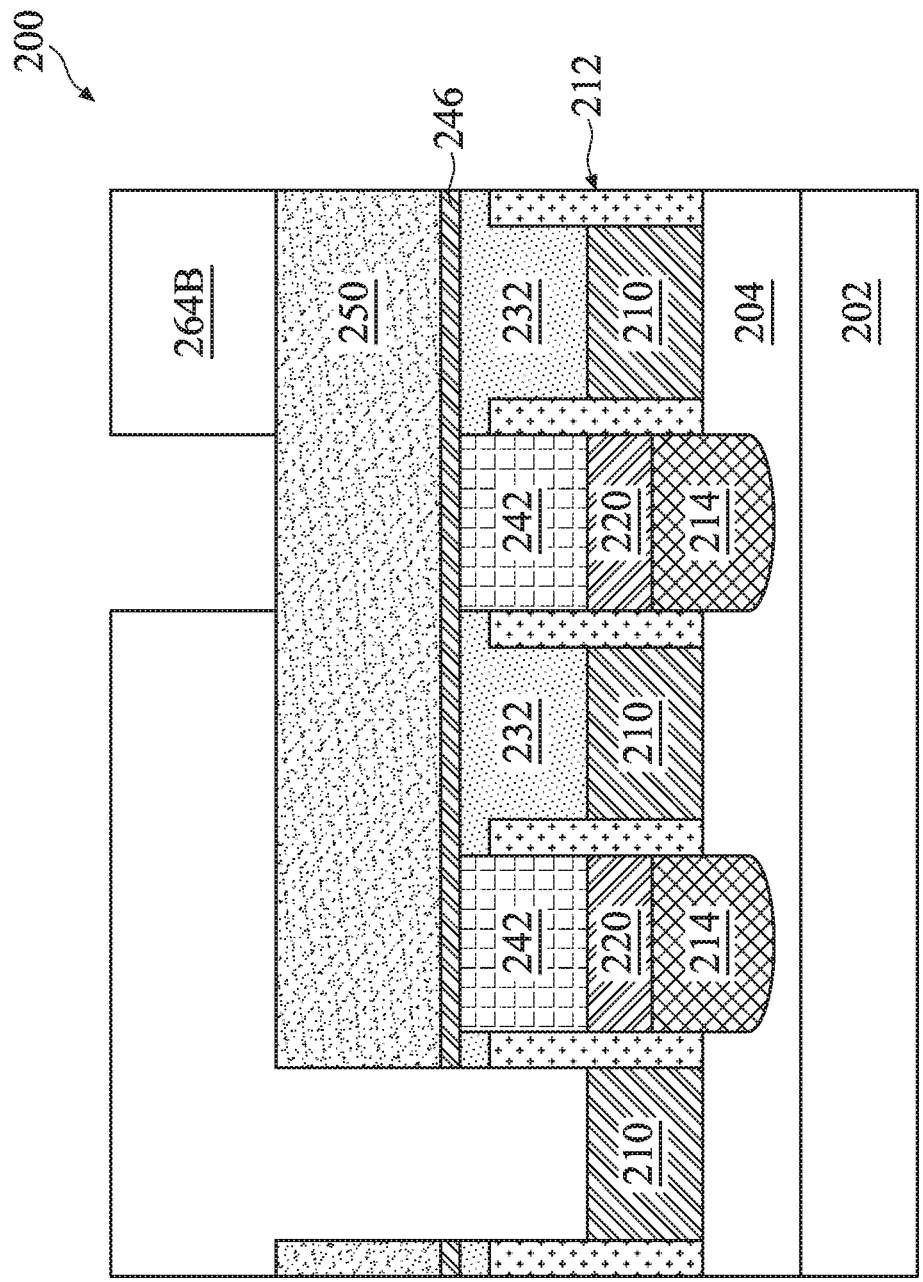
Figure 11D:
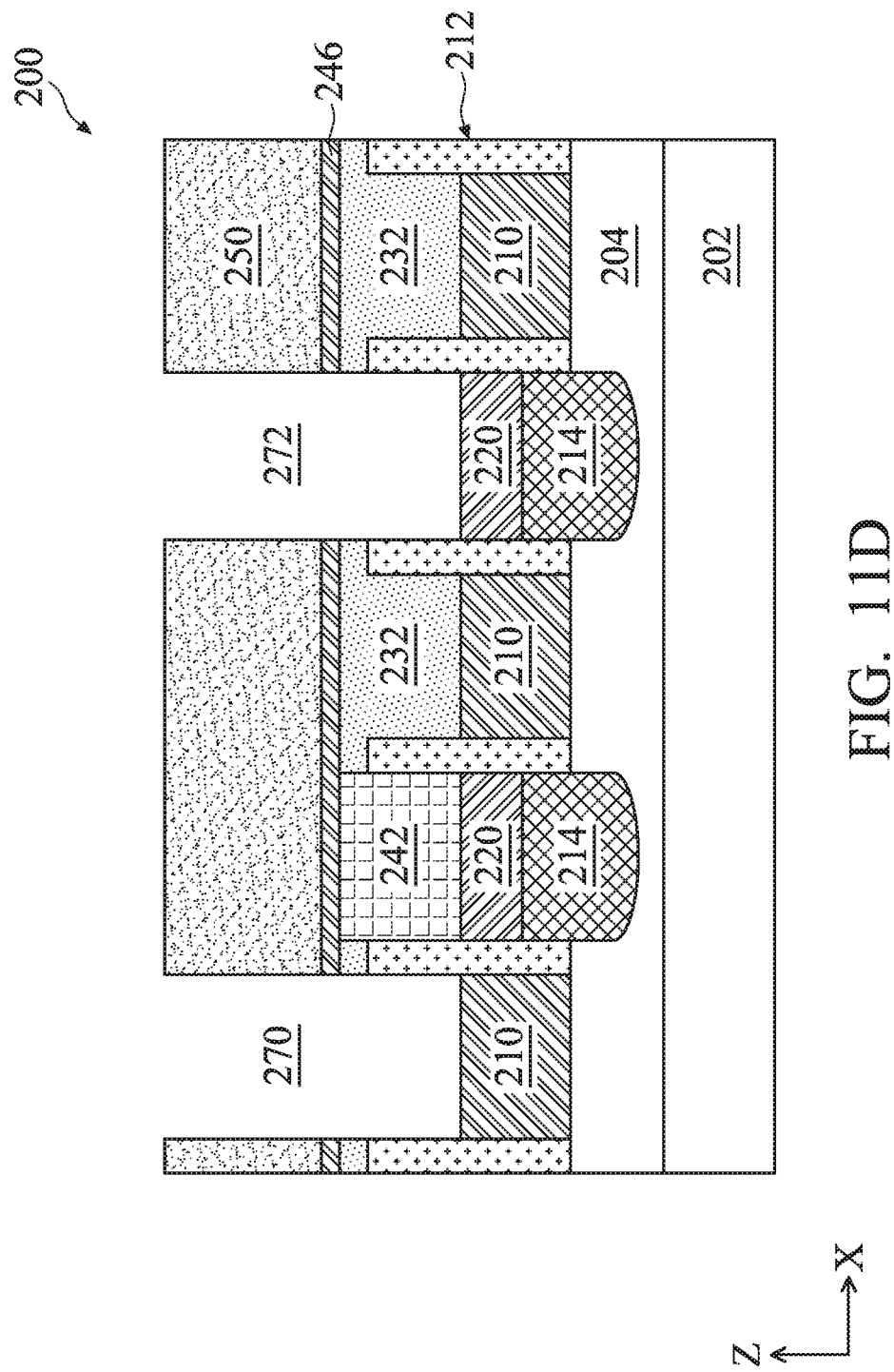

Referring to FIGS. 11C and 11D, the method 100 forms the trench 272 to expose the S/D contact 220 in a series of patterning and etching processes similar to those discussed above with respect to forming the trench 270. For example, the method 100 first forms a patterned masking element 264B to expose portions of the ILD layer 250, the ESL 246, and the dielectric layer 242 disposed over the S/D contact 220, filling the trench 270 as a result. The portions of the ILD layer 250, the ESL 246, and the dielectric layer 242 are subsequently removed to expose the S/D contact 220 using the patterned masking element 264B as an etch mask. It is noted that the process of forming the trench 272 may differ from that of trench 270 in terms of the suitable etchant selected to etch the dielectric layer 242, which is different from the dielectric layer 232 in composition. Thereafter, the patterned masking element 264B is removed from the device 200 by a suitable method as discussed above to expose both the HKMG structure 210 and the S/D contact 220.

Figure 11E:
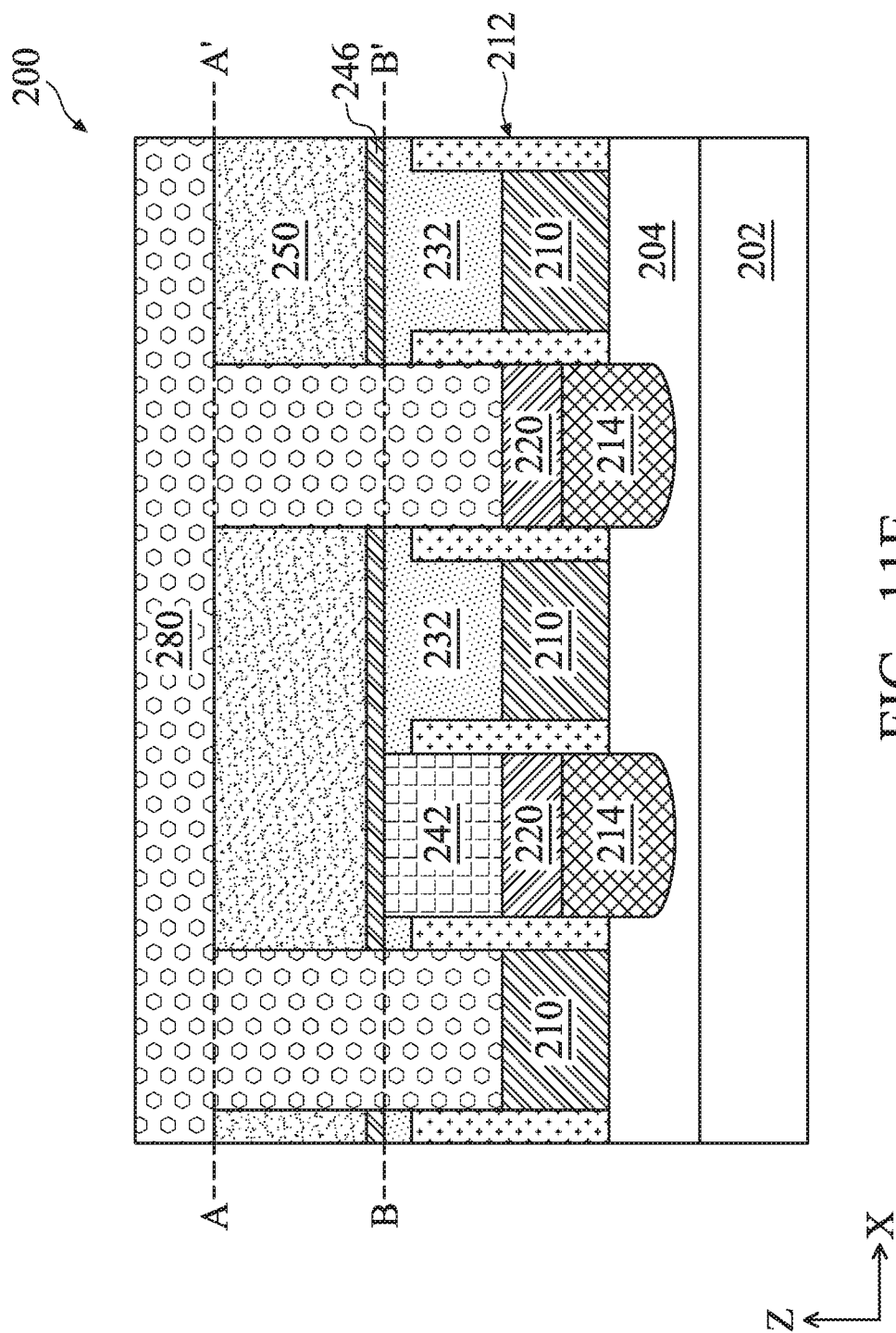
Figure 11F:
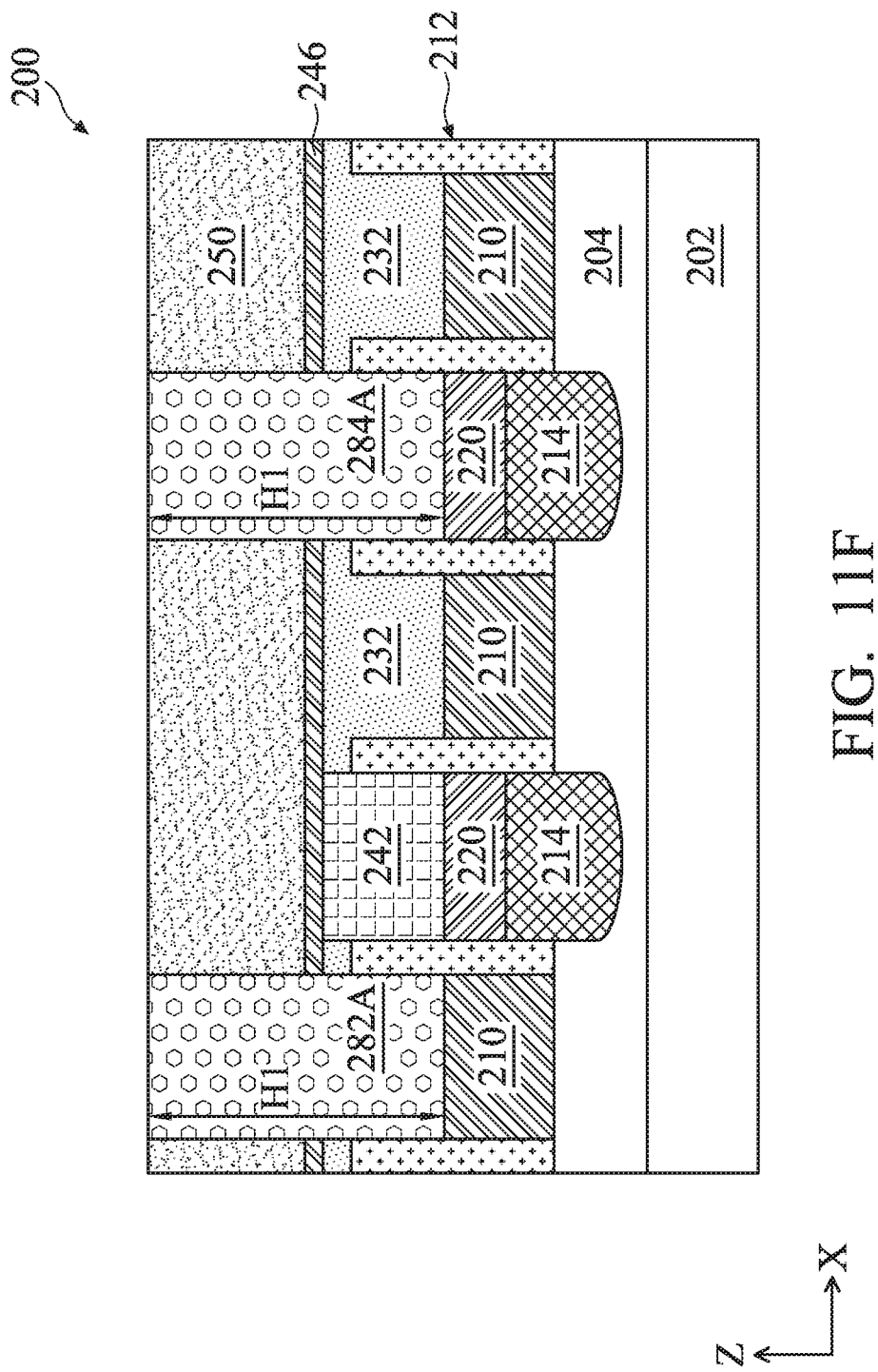

Referring now to FIG. 11E, the method 100 at operation 110 deposits a conductive material 280 in the trenches 270 and 272 and over portions of the ILD layer 250. The conductive material 280 may include Co, W, Ru, Cu, Ta, Ti, Mo, Ni, other suitable materials, or combinations thereof. The conductive material 280 may be deposited by any suitable method, such as CVD, PVD, plating, other suitable methods, or combinations thereof. In some embodiments, a barrier layer (not depicted) is formed in the trenches 270 and 272 before depositing the conductive material 280. The barrier layer may include TiN, TaN, other suitable materials, or combinations thereof, and may be deposited by, for example, an ALD process. Thereafter, referring to FIG. 11F, the method 100 at operation 112 removes portions of the conductive material 280 formed over the ILD layer 250 to form a via 282A over the HKMG structure 210 and a via 284A over the S/D contact 220. In the present embodiments, the method 100 performs one or more CMP processes along line AA' as depicted in FIG. 11E to planarize a top portion of the device 200. As a result, the vias 282A and 284A may be defined by a height H1 as depicted in FIG. 11F.

Figure 11G:
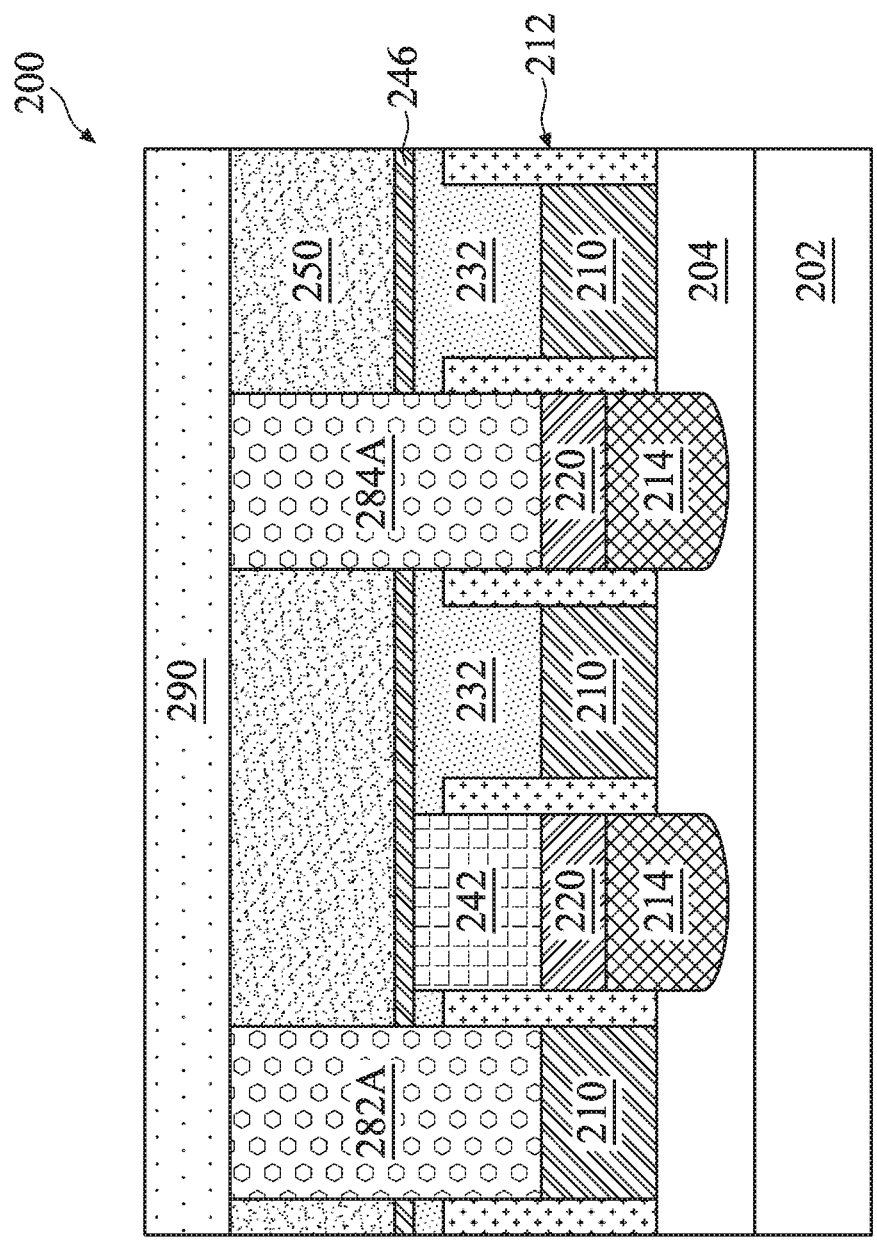

Referring to FIG. 11G, the method 100 at operation 114 subsequently forms an interconnect feature 290 over the device 200. In some embodiments, the interconnect feature 290 is a horizontal interconnect feature, such as a conductive line, configured to provide routing options for the via 282A and/or the via 284A according to various design requirements. As such, the interconnect feature 290 electrically couples the via 282A and/or the via 284A to one or more subsequently-formed interconnect features. The interconnect feature 290 may include Co, W, Ru, Cu, Ta, Ti, Mo, Ni, other suitable materials, or combinations thereof and may be formed by any suitable process, such as a damascene process or a series of deposition (by plating, for example) and patterning processes. In an example embodiment, the interconnect feature 290 is formed by first depositing a conductive layer over the ILD layer 250 by a suitable method such as plating and subsequently patterning the conductive layer using a patterned masking element to form the interconnect feature 290. In some embodiments, a barrier layer (not depicted) is formed over the device 200 before forming the interconnect feature 290. The barrier layer may include TiN, TaN, other suitable materials, or combinations thereof, and may be deposited by, for example, an ALD process.

Figure 12A:
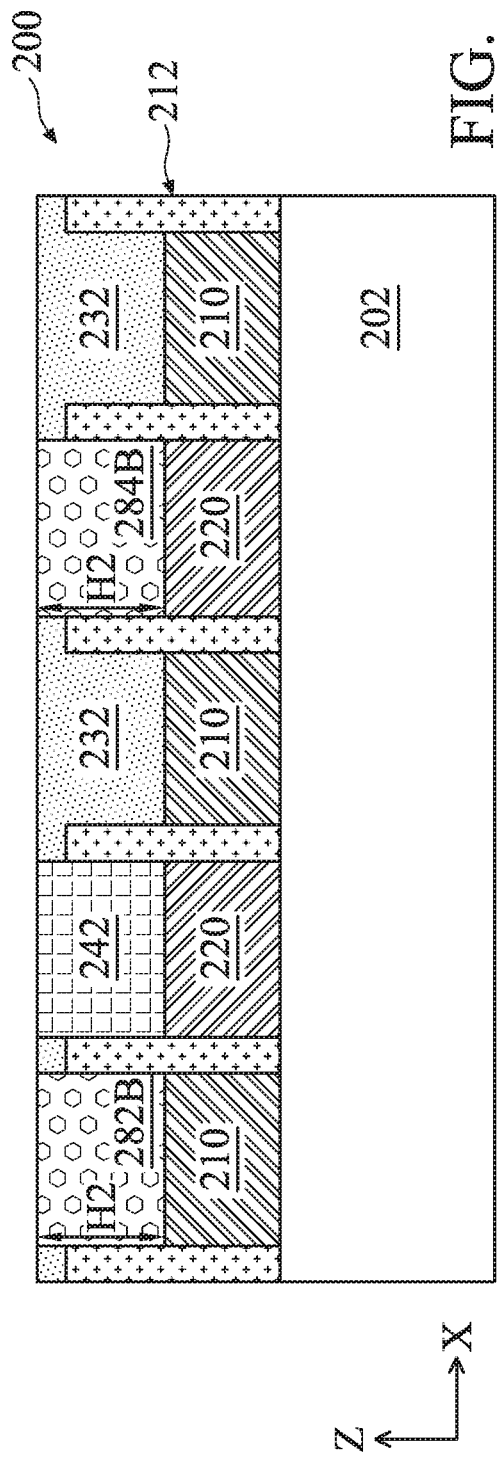
FIG. 12A is a cross-sectional view of an embodiment of the semiconductor device of FIG. 2A and/or FIG. 2B along line LL' during intermediate steps of an embodiment of the method of FIG. 1 according to various aspects of the present disclosure.
Figure 12B:
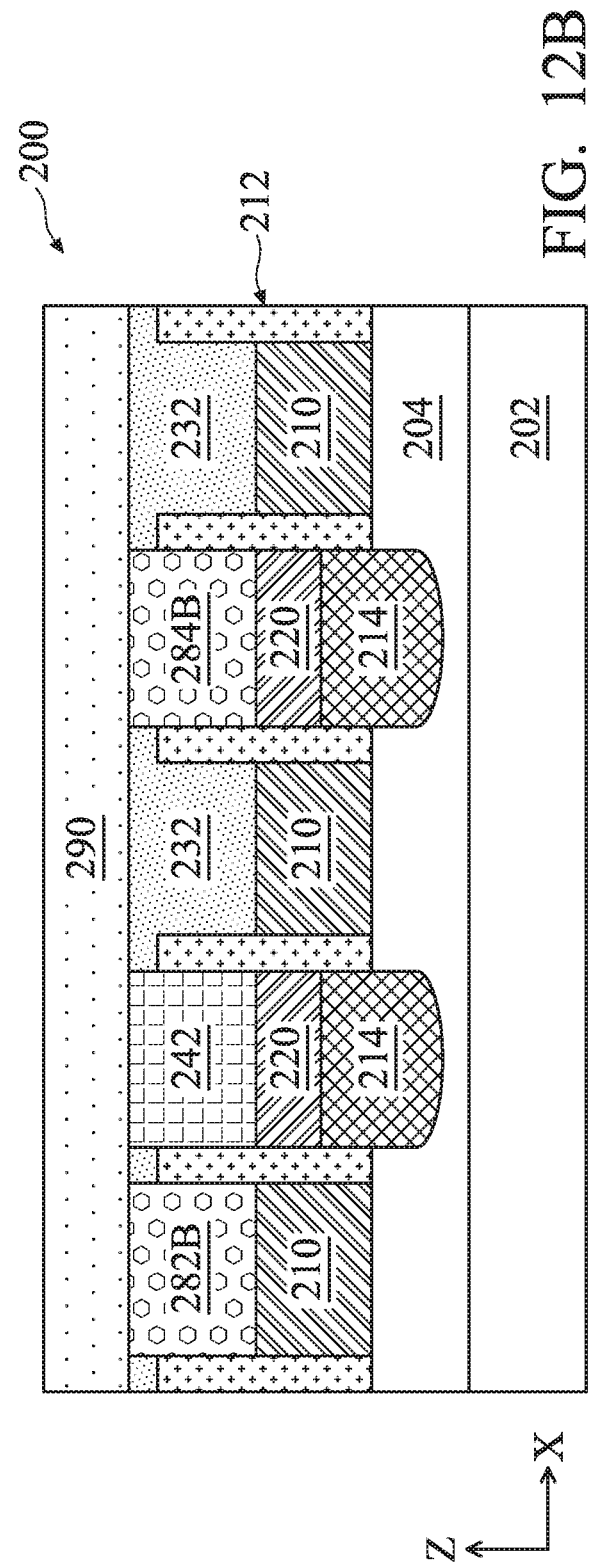

In some embodiments, referring back to FIG. 11E, the method 100 at operation 112 alternatively planarizes the top portion of the device 200 along line BB' to form a via 282B over the HKMG structure 210 and a via 284B over the S/D contact 220 as depicted in FIG. 12A, consequently removing the ILD layer 250 and the ESL 246 from the device 200. In this regard, a height H2 of the vias 282B and 284B is less than the height H1 of the vias 282A and 284A (see FIG. 11F). Such reduction in height (or thickness) results in the vias 282B and 284B having lowered contact resistance than the vias 282A and 284A, respectively. Thereafter, referring to FIG. 12B, the method 100 at operation 114 forms the interconnect feature 290 over the vias 282B and 284B in a process similar to that discussed above in reference to FIG. 11G.

Figure 13A:
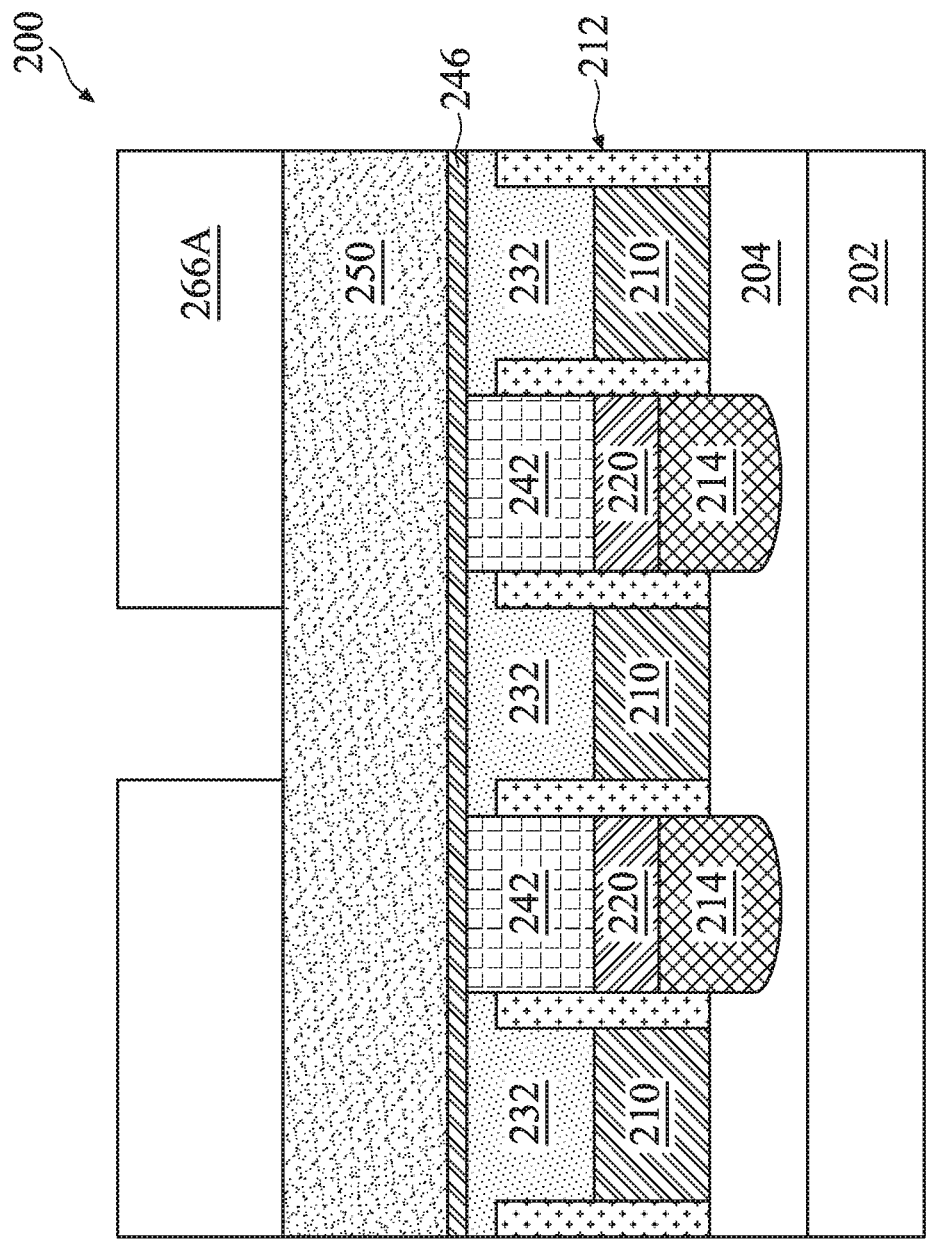
Figure 13B:
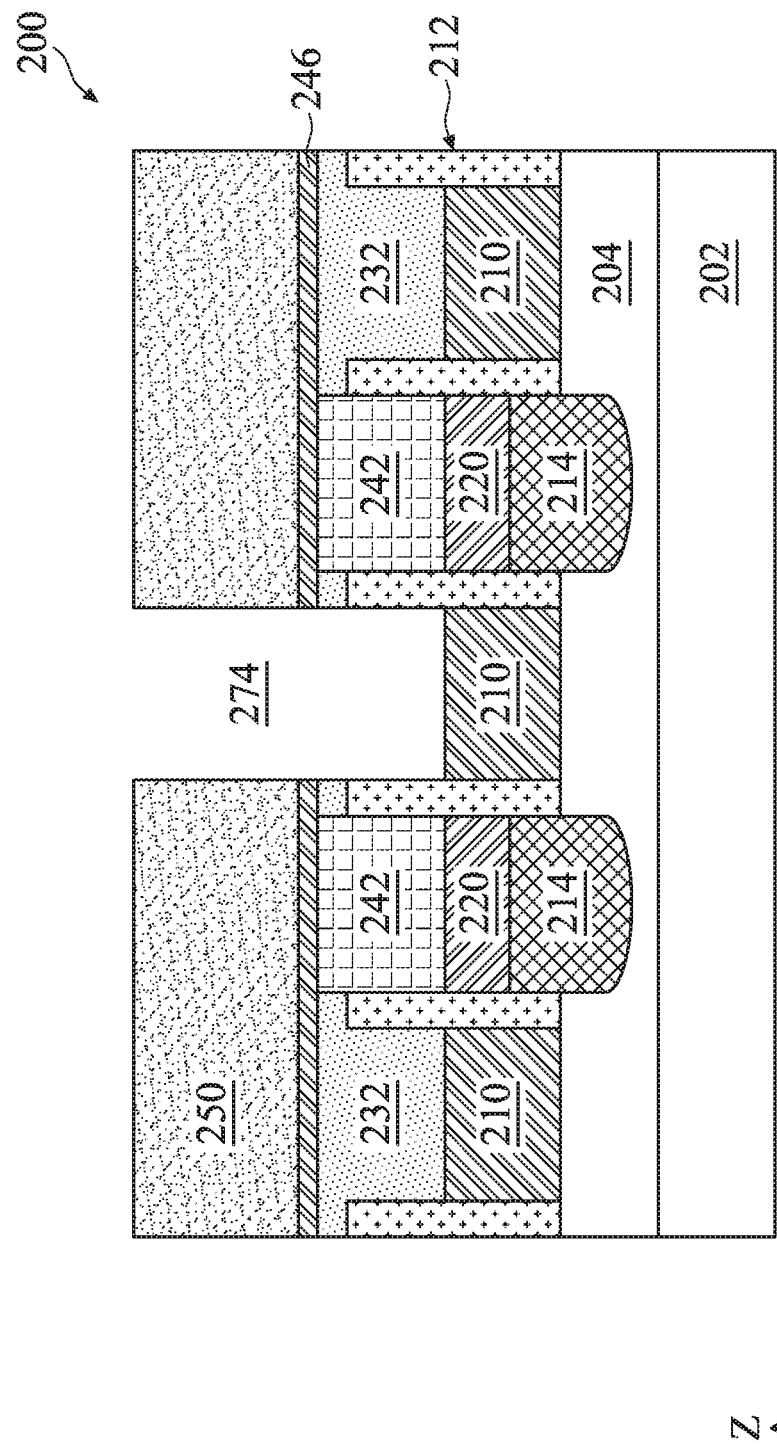
Figure 13C:
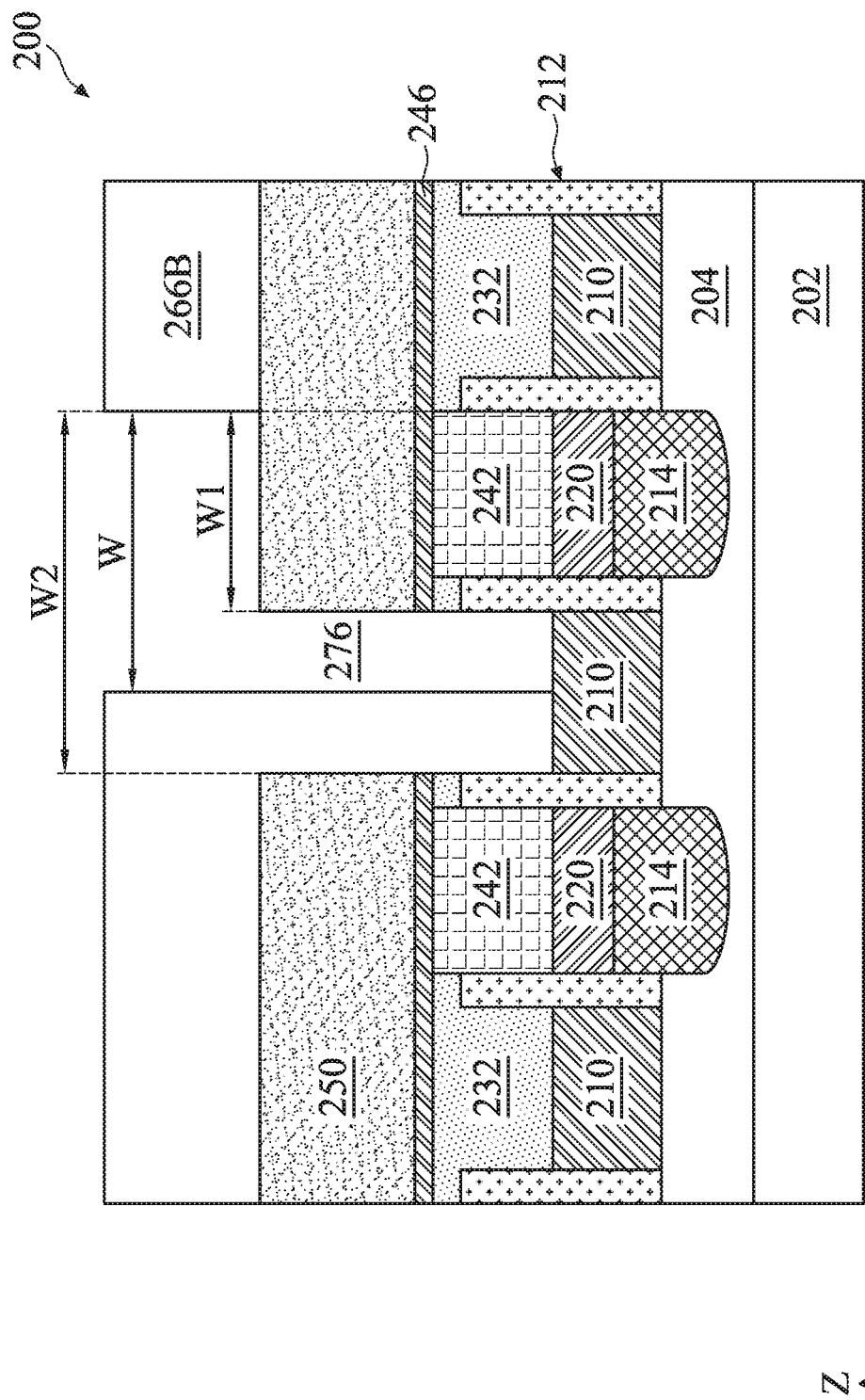

Now turning to Pathway B and referring to FIGS. 13A-13C, the method 100 at operation 116 patterns portions of the device 200 to expose one of the HKMG structures 210 and its neighboring S/D contacts 220 in a trench 274. The method 100 forms the trench 274 in a series of patterning and etching processes similar to those discussed above with respect to operation 108. For example, referring to FIG. 13A, the method 100 forms a patterned masking element 266A that includes an opening corresponding to the trench 274. The patterned masking element 266A may be similar to the patterned masking element 264A in composition and may be formed in a series of lithography processes similar to those discussed above with respect to operation 108. Referring to FIG. 13B, the method 100 then removes portions of the ILD layer 250, the ESL 246, and the dielectric layer 232 exposed in the trench 274 using the patterned masking element 266A as an etch mask. The method 100 may remove portions of the ILD layer 250, the ESL 246, and the dielectric layer 232 in one or more etching processes, such as a dry etching process and/or an RIE process. Thereafter, the patterned masking element 266A is removed from the device 200 by a suitable method, such as resist stripping and/or plasma ashing.

Thereafter, referring to FIG. 13C, the method 100 continues to pattern portions of the device 200 to expose the S/D contact 220 disposed adjacent to the exposed HKMG structure 210 as well as the gate spacer 212 disposed therebetween. To do so, the method 100 implements a patterned masking element 266B having an opening 276 over the device 200, thereby partially filling the trench 274. In some examples, though not depicted, forming the patterned masking element 266B may completely fill the trench 274. The patterned masking element 266B may be similar to the patterned masking element 264A in composition and may be formed in a series of lithography processes similar to those discussed above with respect to operation 108. In the present embodiments, the opening 276 is defined by a width W that is at least the same as a width W1 spanning from a sidewall of the S/D contact 220 and to a sidewall of the gate spacer 212, but not exceeding a width W2 spanning from the sidewall of the S/D contact 220 to a sidewall of the HKMG structure 210 partially exposed by the opening 276.

Figure 13D:
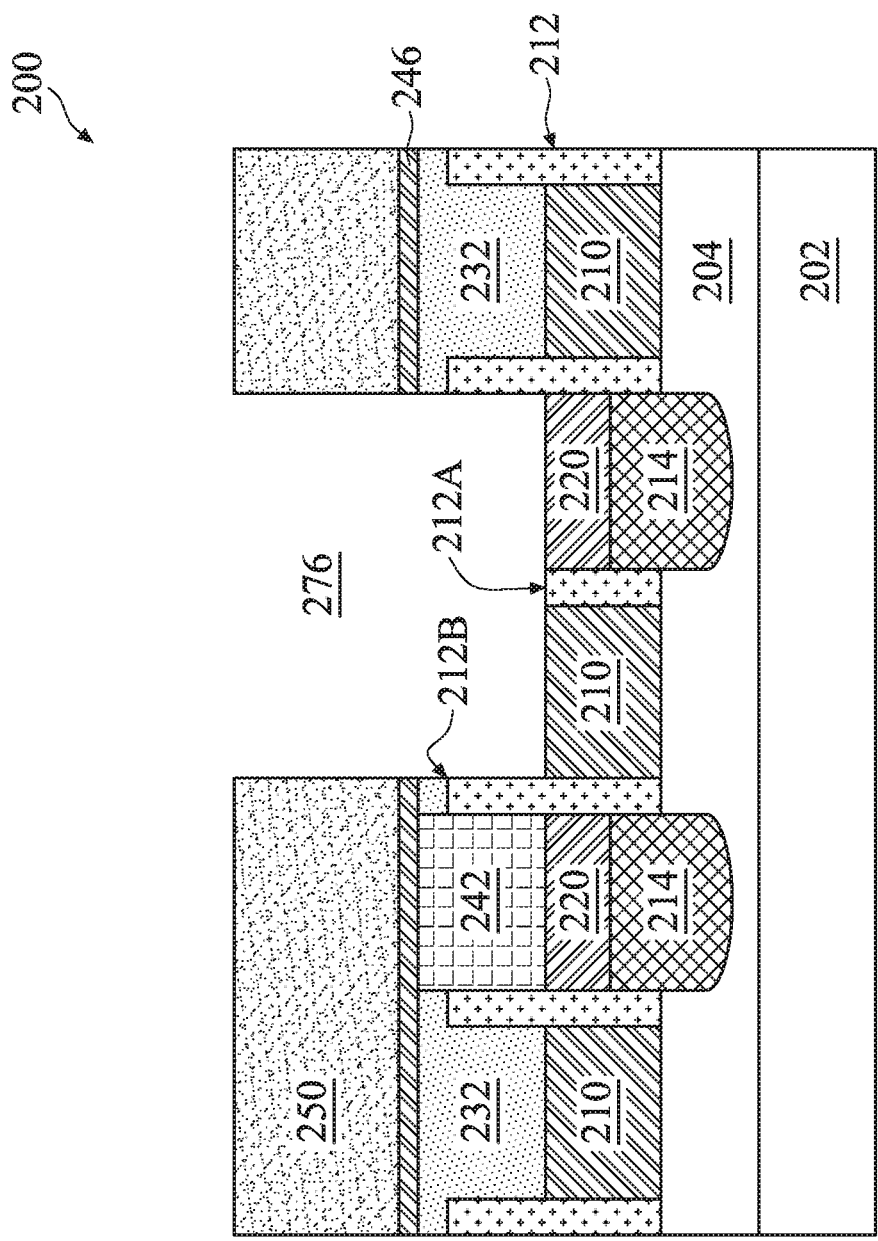

Using the patterned masking element 266B as an etch mask, referring to FIG. 13D, the method 100 at operation 118 removes portions of the gate spacer 212, the ILD layer 250, the ESL 246, and the dielectric layer 242 exposed in the opening 276. In the present embodiments, the method 100 removes exposed portions of the gate spacer 212, the ILD layer 250, the ESL 246, and the dielectric layer 242 in one or more etching processes, such as a dry etching process, a wet etching process, and/or an RIE process. In other words, after performing operation 118, gate spacer 212A disposed on one of the sidewalls of the HKMG structure 210 (i.e., disposed between the HKMG structure 210 and the S/D contact 220 and exposed in the opening 276) is shorter than gate spacer 212B disposed on the other one of the sidewalls of the HKMG structure 210 (i.e., not exposed in the opening 276). In the present embodiments, the method 100 implements a dry etching process that utilizes a fluorine-containing etchant (e.g., $CF_4$, $SF_6$, $CH_2F_2$, $CHF_3$, $C_2F_6$, other fluorine-containing etchants, or combinations thereof), $H_2$, $O_2$, other suitable etchants, or combinations thereof at operation 118. Notably, an etchant utilized for the one or more etching processes at operation 118 does not remove, or substantially remove, portions of the HKMG structure 210 and the S/D contact 220. Thereafter, still referring to FIG. 13D, the patterned masking element 266B is removed from the device 200 by a suitable method, such as resist stripping and/or plasma ashing, thereby expanding the opening 276 to fully expose both the HKMG structure 210 and the S/D contact 220.

Figure 13E:
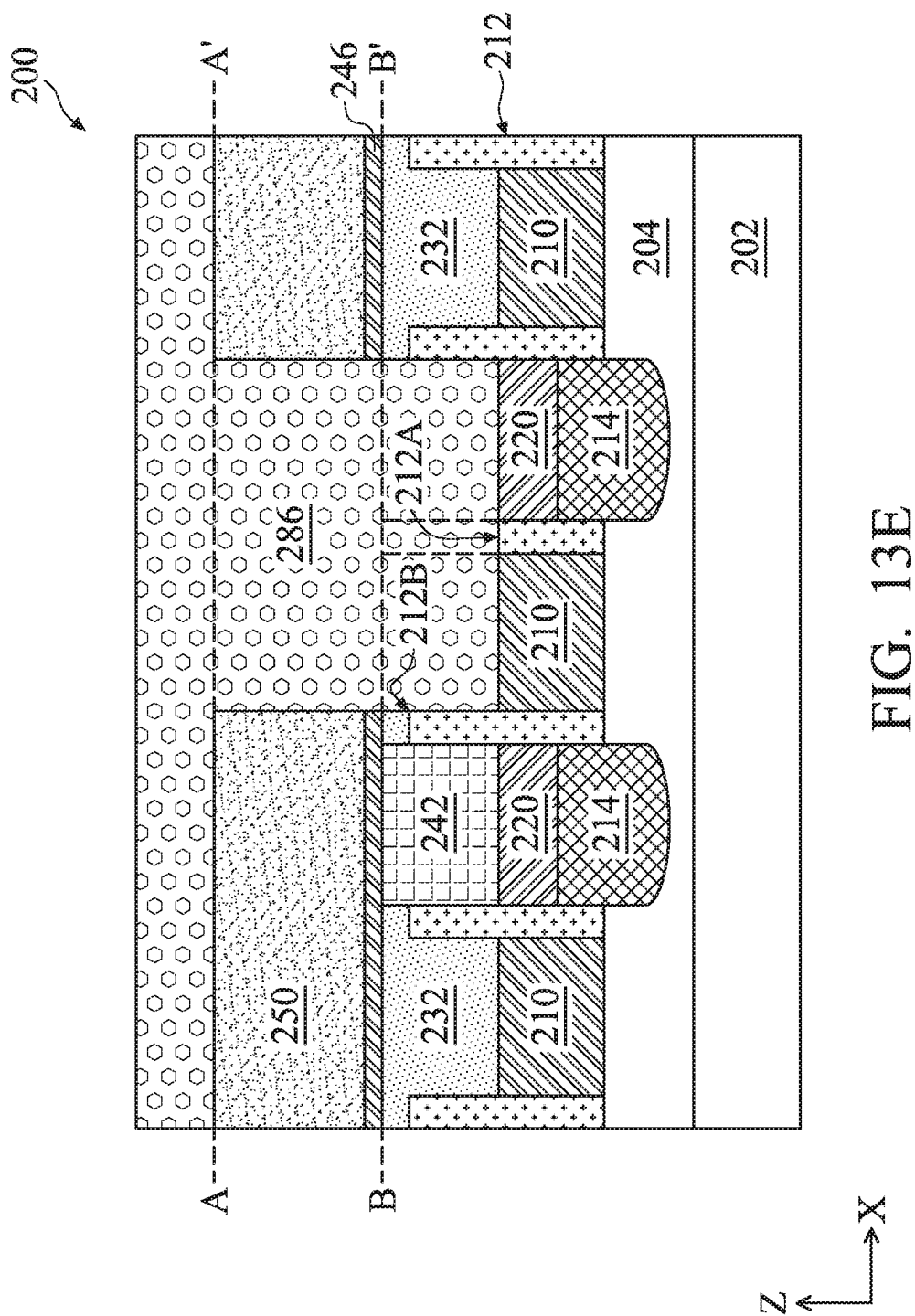
Figure 13F:
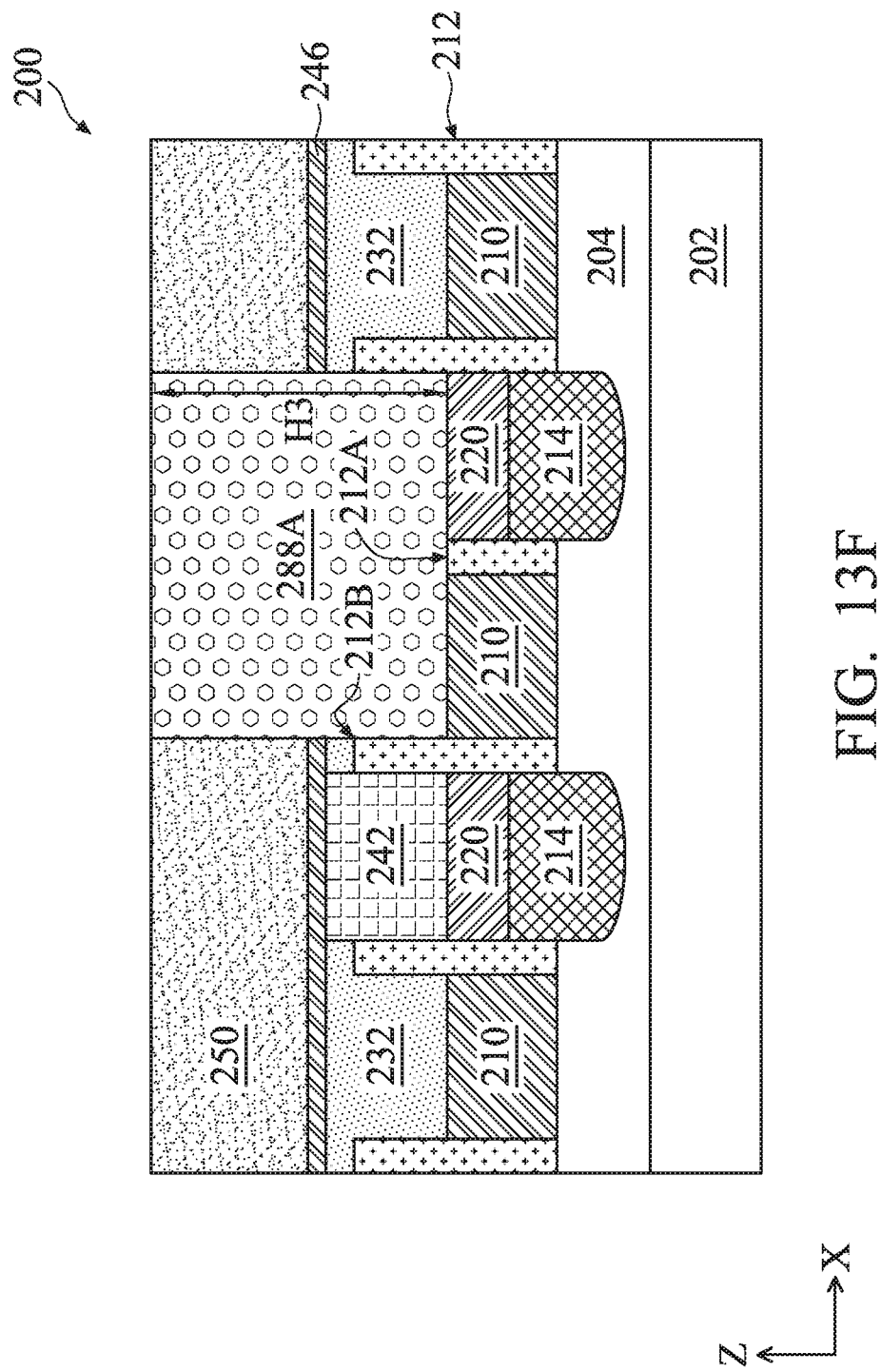

Referring then to FIG. 13E, the method 100 at operation 120 deposits a conductive material 286 in the opening 276 and over portions of the ILD layer 250. The conductive material 286 may include Co, W, Ru, Cu, Ta, Ti, Mo, Ni, other suitable materials, or combinations thereof. In some embodiments, the conductive material 286 is substantially the same as the conductive material 280. The conductive material 286 may be deposited by any suitable method, such as CVD, PVD, plating, other suitable methods, or combinations thereof. In some embodiments, the conductive material 286 is deposited in a process substantially the same as the conductive material 280. In some embodiments, a barrier layer (not depicted) is formed in the opening 276 before depositing the conductive material 286. The barrier layer may include TiN, TaN, other suitable materials, or combinations thereof, and may be deposited by, for example, an ALD process. Thereafter, referring to FIG. 13F, the method 100 at operation 122 planarizes the top surface of the device 200 to form a BCT 288A that electrically couples the HKMG structure 210 to the neighboring S/D contact 220. In the present embodiments, the method 100 performs one or more CMP processes along line AA' as depicted in FIG. 13E to remove excess conductive material 286 from a top surface of the ILD layer 250. As a result, the BCT 288A may be defined by a height H3 as depicted in FIG. 13F.

Figure 13G:
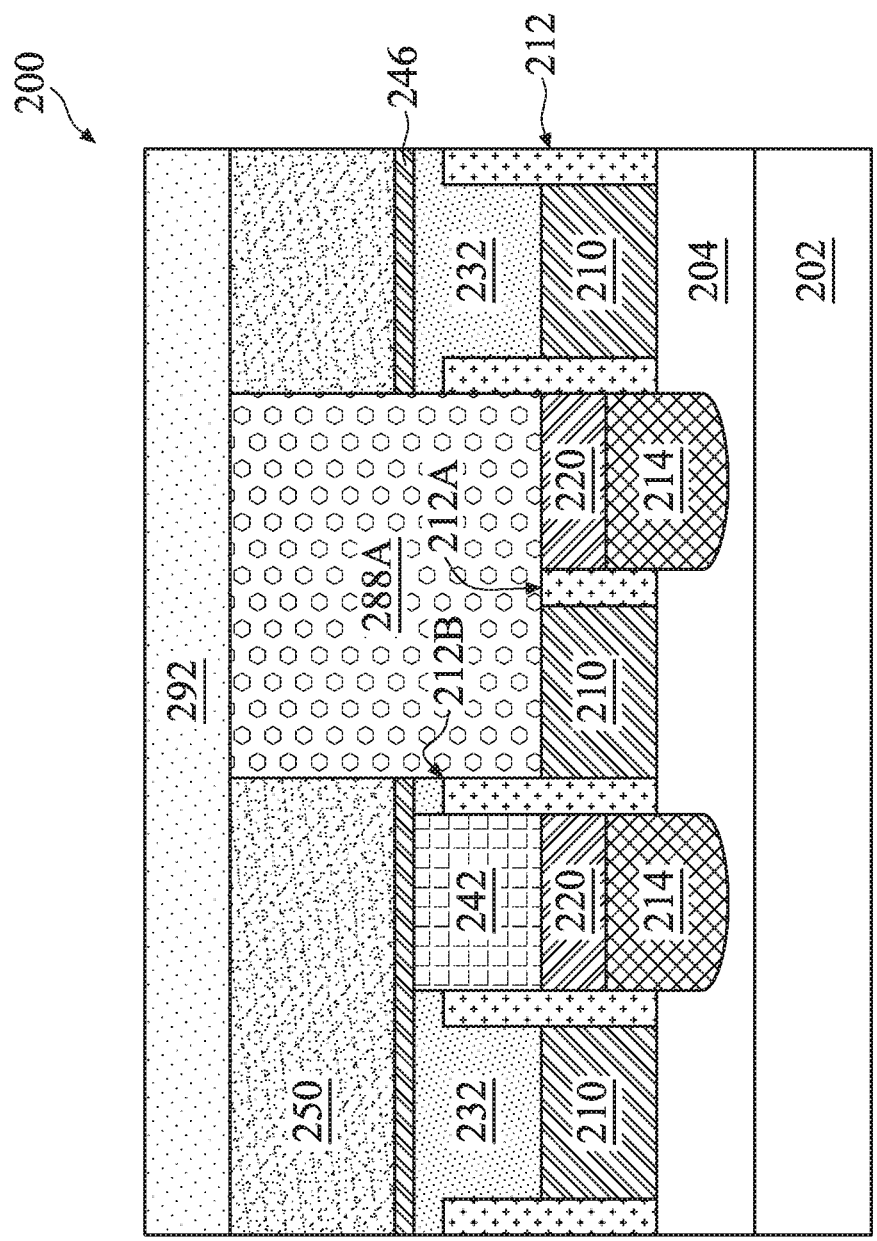

Referring to FIG. 13G, the method 100 at operation 124 subsequently forms a dielectric layer 292 over the device 200. Because the BCT 288A (as a butted contact in general) locally connects a gate (e.g., the HKMG structure 210) to an adjacent S/D contact (e.g., the S/D contact 220), the dielectric layer 292 is configured to isolate the BCT 288A from an interconnect feature (e.g., a conductive line) formed thereover to avoid potential electrical shorting between them. In some examples, the dielectric layer 292 may be a dielectric hard mask and may include any suitable dielectric material, such as silicon nitride, silicon carbide, silicon carbonitride, silicon oxide, silicon oxynitride, silicon oxycarbonitride, aluminum oxide, aluminum nitride, aluminum oxynitride, zirconium oxide, zirconium nitride, zirconium aluminum oxide, hafnium oxide, other suitable materials, or combinations thereof.

In some embodiments, referring back to FIG. 13E, the method 100 at operation 122 may alternatively planarize the top portion of the device 200 along line BB' to form a BCT 288B as depicted in FIG. 14A, consequently removing the ILD layer 250 and the ESL 246 from the device 200. In this regard, a height H4 of the BCT 288B is less than the height H3 of the BCT 288A as depicted in FIG. 13F, resulting in the BCT 288B having lower contact resistance than the BCT 288A. However, if a top portion of the gate spacer 212 was not removed at operation 118, as indicated by the dotted profile, planarizing the device 200 along line BB' would in effect separate the BCT 288B into two portions that are no longer connected, thus degrading the function of the BCT 288B. Therefore, removing the top portion of the gate spacer 212 relative to the HKMG structure 210 and the S/D contact 220 allows the height of the BCT to be reduced for achieving lowered contact resistance. Thereafter, referring to FIG. 14B, the method 100 at operation 124 forms the dielectric layer 292 over the BCT 288B in a process similar to that discussed above in reference to FIG. 13G.

Figure 15A:
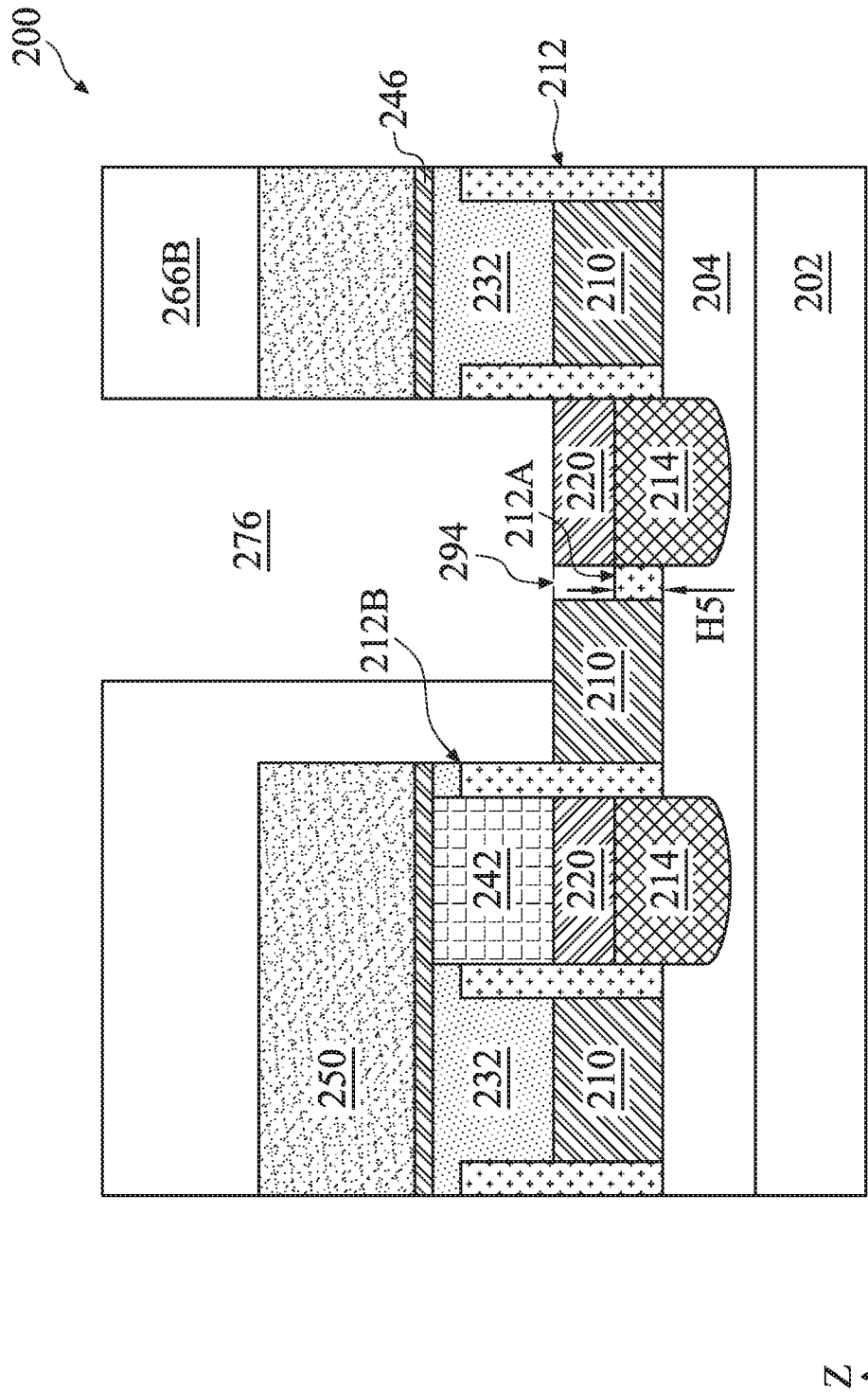
Figure 16A:
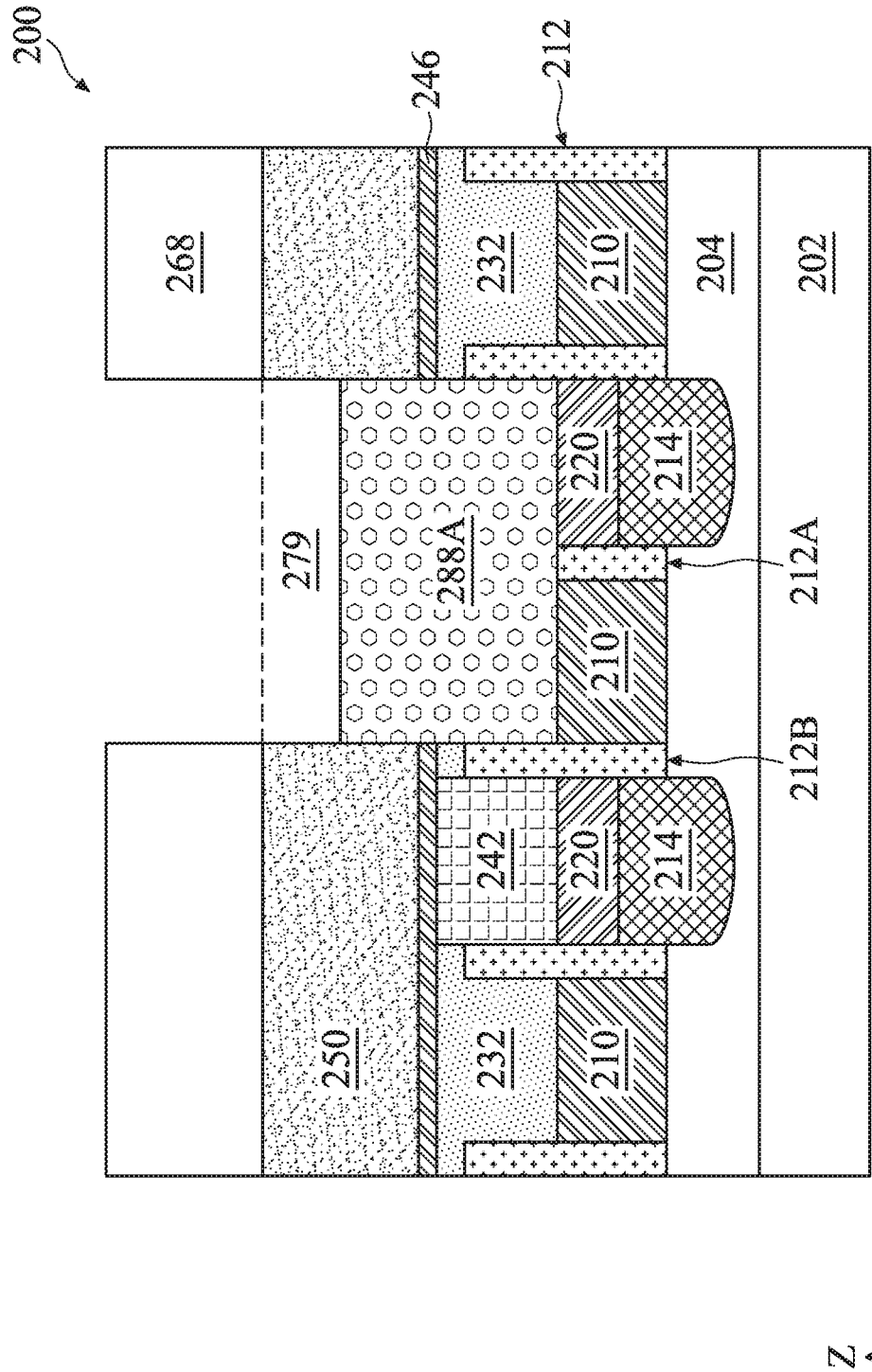

In some embodiments, referring to FIG. 15A, the method 100 at operation 118 further removes a portion of the gate spacer 212A to form an opening 294 in the opening 276 such that a top surface of the gate spacer 212A is below a top surface of the S/D contact 220 and the HKMG structure 210 exposed in the opening 276. Stated differently, the opening 294 extends the opening 276 downward to below the top surface of the HKMG structure 210 and the top surface of the S/D contact 220. In the present embodiments, the method 100 removes the portion of the gate spacer 212A without removing, or substantially removing, the HKMG structure 210 and the S/D contact 220. In some embodiments, the method 100 selectively removes the portion of the gate spacer 212A in one or more etching processes, such as a dry etching process, a wet etching process, and/or an RIE process. In some embodiments, the amount of the gate spacer 212A removed may be controlled by the duration of the etching process and/or the pressure of the etchant applied during the etching process. In the present embodiments, a height H5 of the remaining gate spacer 212A is not limited to a specific value so long as the top surface of the remaining gate spacer 212A is below the HKMG structure 210 and the S/D contact 220. In one such example, the height H5 may be 0, i.e., the gate spacer 212A exposed in the opening 276 may be completely removed from the device 200. Thereafter, the patterned masking element 266B is removed from the device 200 by a suitable method, such as resist stripping and/or plasma ashing.

In some embodiments, the same etchant implemented to remove portions of the ILD layer 250, the ESL 246, and the dielectric layer 242 exposed in the opening 276 may be implemented to form the opening 294. In other words, the opening 294 may be formed by increasing the duration of the one or more etching processes implemented to form the opening 276. In alternative embodiments, a different etchant and/or a different etching process is implemented to form the opening 294 after forming the opening 276, so long as such etchant does not etch, or substantially etch, portions of the HKMG structure 210 and the S/D contact 220.

Subsequently, referring to FIG. 15B, the method 100 deposits the conductive material 286 in the openings 276 and 294 in a process similar to that discussed above in reference to FIG. 13E. In the present embodiments, the conductive material 286 extends to contact sidewalls of the HKMG structure 210 and the S/D contact 220 as it fills the opening 294. Thereafter, referring to FIG. 15C, the method 100 planarizes the top surface of the device 200 to form a BCT 288C that electrically couples the HKMG structure 210 to the S/D contact 220. In the present embodiments, a bottom portion of the BCT 288C extends to contact sidewalls of the HKMG structure 210 and the S/D contact 220. For embodiments in which the gate spacer 212 is completely removed to form the opening 294, a bottom portion of the conductive material 286 extends to contact the fin 204. Stated differently, the present embodiments provide methods of replacing at least a portion of the gate spacer 212 with a conductive material of which the BCT 288C is comprised. Comparing to the BCT 288A depicted in FIG. 13G, the bottom portion of the BCT 288C provides additional contact between the HKMG structure 210 and the S/D contact 220 for improved device performance.

Figure 15B:
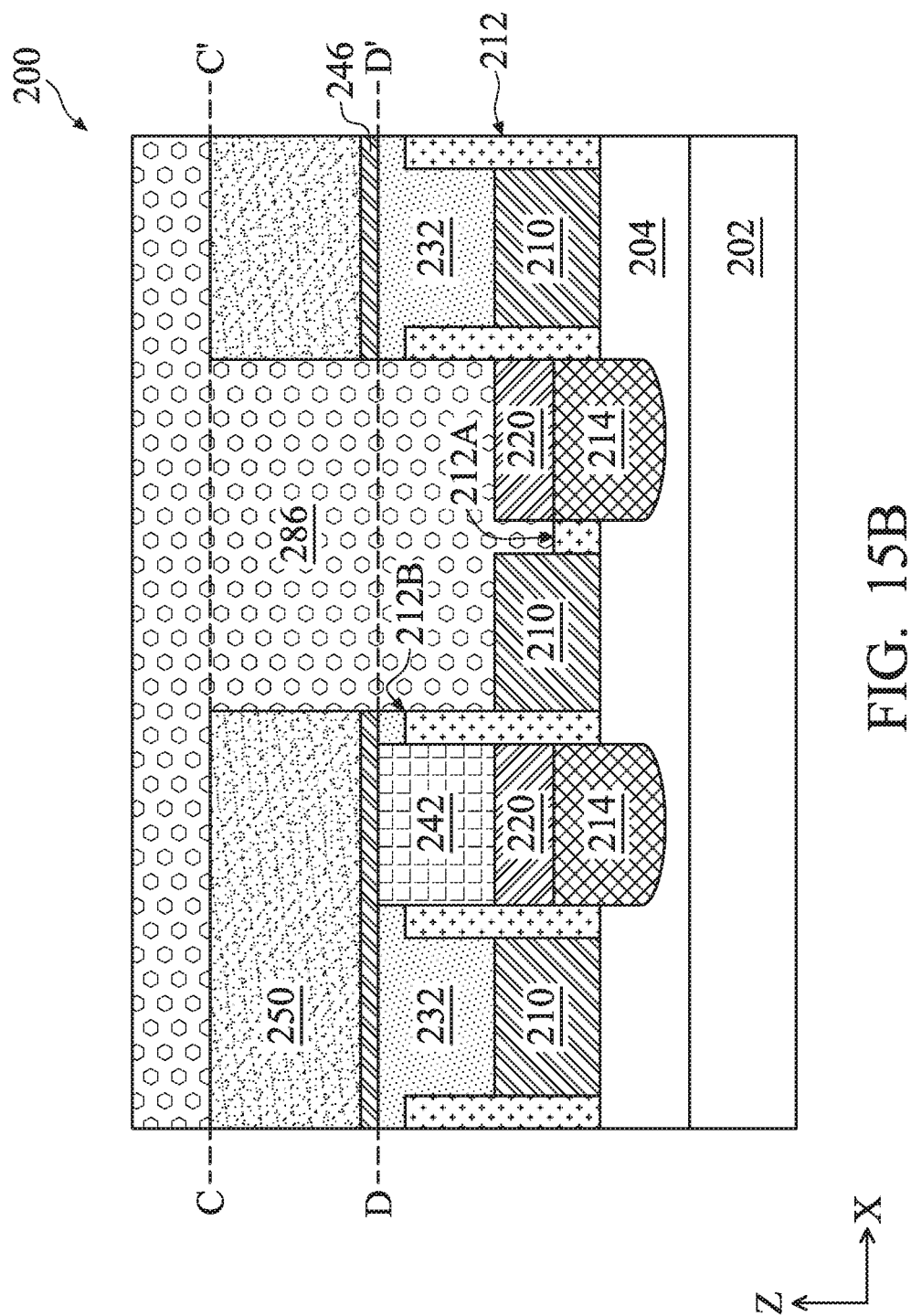
Figure 15C:
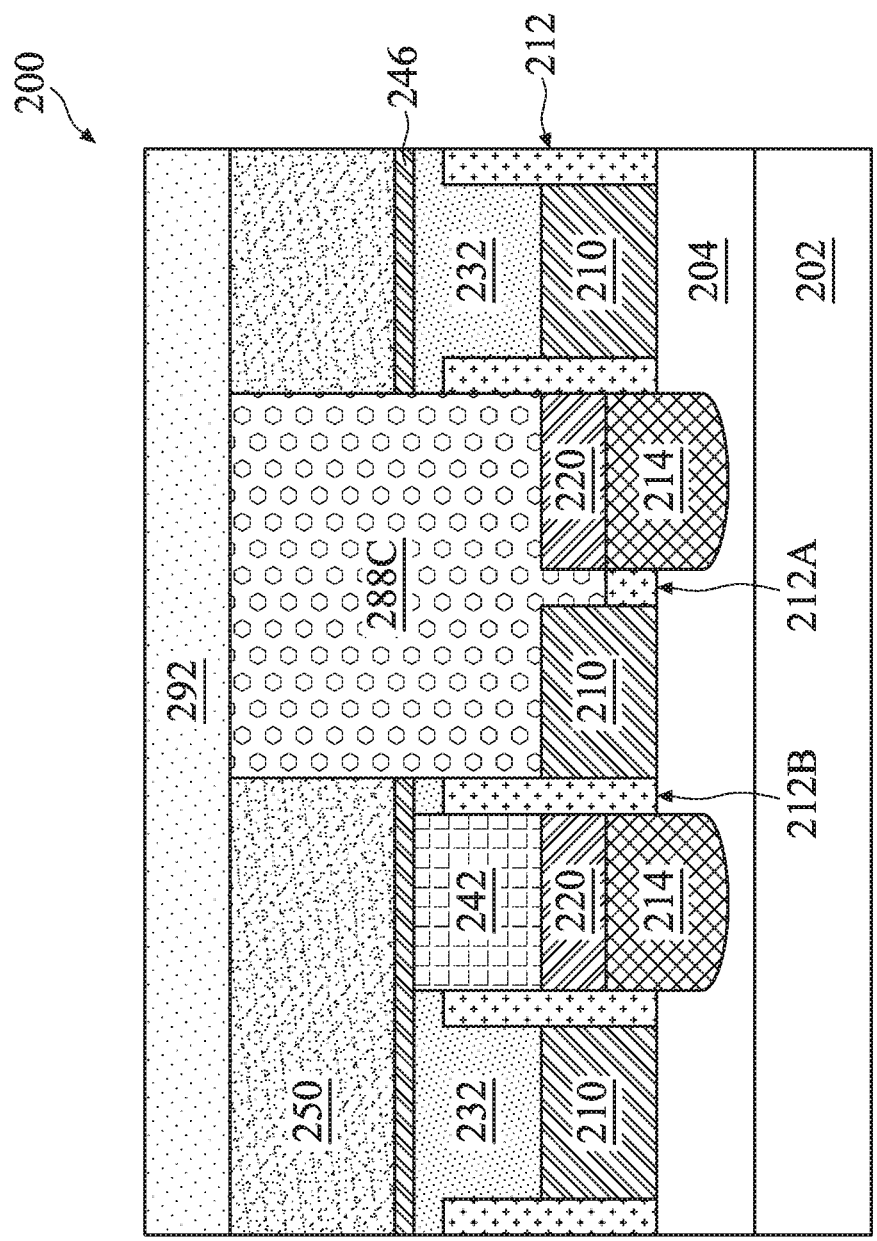
Figure 15D:
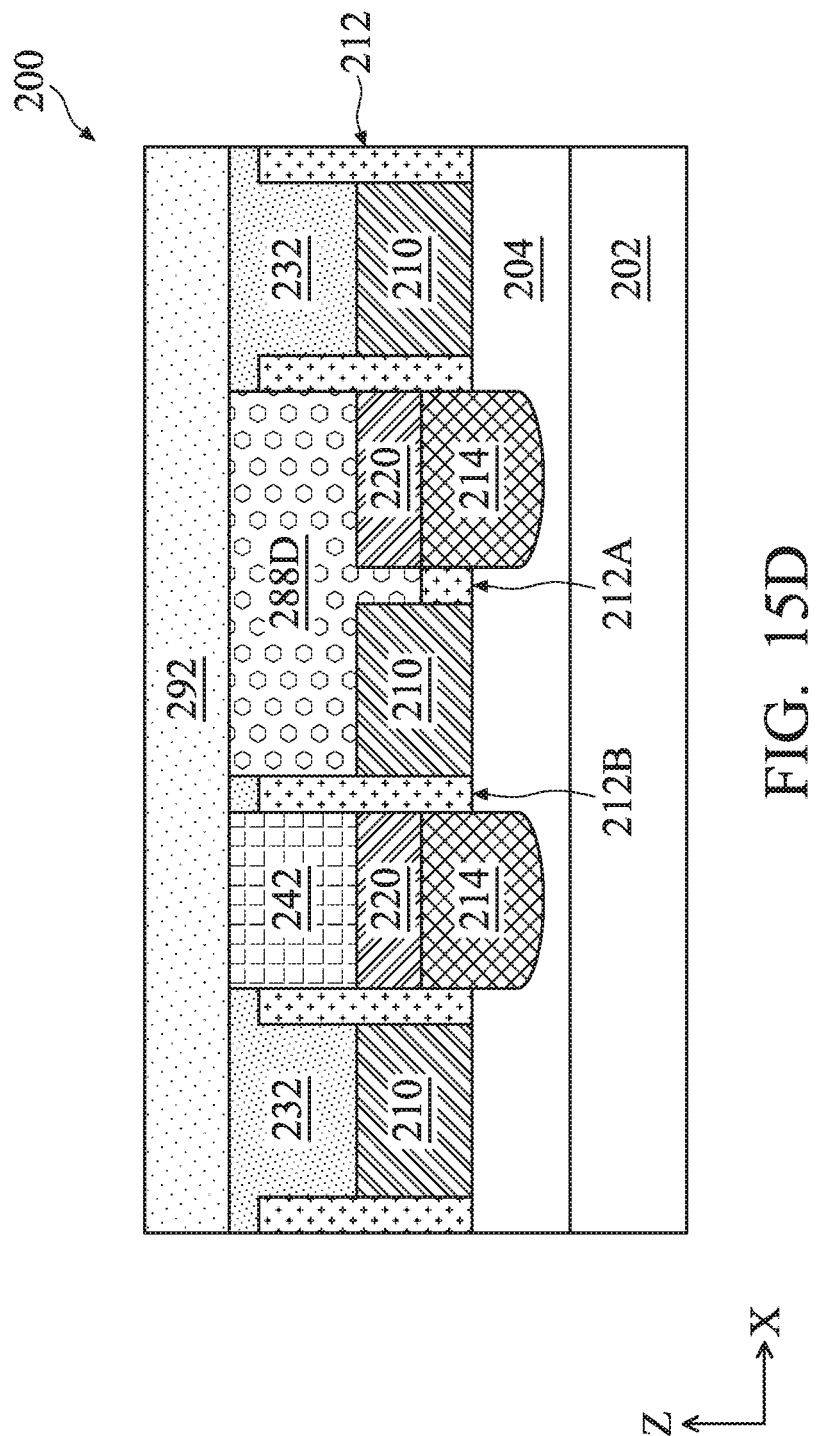

The device 200 may be planarized along dotted line CC' shown in FIG. 15B, i.e., along the top surface of the ILD layer 250, resulting in the structure depicted in FIG. 15C. The method 100 subsequently forms the dielectric layer 292 over the BCT 288C in a process similar to that discussed above in reference to FIG. 13G. Alternative to the embodiment depicted in FIG. 15C, referring to FIG. 15D, the device 200 may be planarized along dotted line DD' shown in FIG. 15B, i.e., along the top surface of the dielectric layer 232 (or the dielectric layer 242), thereby removing the ESL 246, to form a BCT 288D at operation 122, followed by forming the dielectric layer 292 over the BCT 288D at operation 124.

Similar to the comparison between the BCT 288A and the BCT 288B, the BCT 288D with its reduced height has lowered contact resistance than the BCT 288C.

In some embodiments, referring to FIG. 16A, the method 100 removes a portion of the BCT 288A to form a trench 279 after performing operation 122, such that a top surface of the remaining portion of the BCT 288A is below the top surface of the ILD layer 250. To do so, the method 100 may form a patterned masking element 268 that includes an opening corresponding to the trench 279. The patterned masking element 268 may be similar to the patterned masking element 264A in composition and may be formed in a series of lithography processes similar to those discussed above with respect to operation 108. The method 100 then removes portions of the BCT 288A using the patterned masking element 268 as an etch mask to form the trench 279. The method 100 may implement any suitable etching process, such as a dry etching process, a wet etching process, RIE, or combinations thereof to form the trench 279. For example, the etching process may be a dry etching process or RIE utilizing a chlorine-containing gas (e.g., $Cl_2$, $CHCl_3$, $CCl_4$, and/or $BCl_3$) as an etchant. Thereafter, the patterned masking element 268 is removed from the device 200 by a suitable method, such as resist stripping and/or plasma ashing. In some examples in which Pathway B is implemented alone, due to the difference in composition between the ILD layer 250 and the BCT 288A, the method 100 may selectively remove the top portion of the BCT 288A with respect to the ILD layer 250 in an etching process without needing to apply the patterned masking element 268. In other words, the method 100 forms the trench 279 in a self-aligned manner.

Figure 16B:
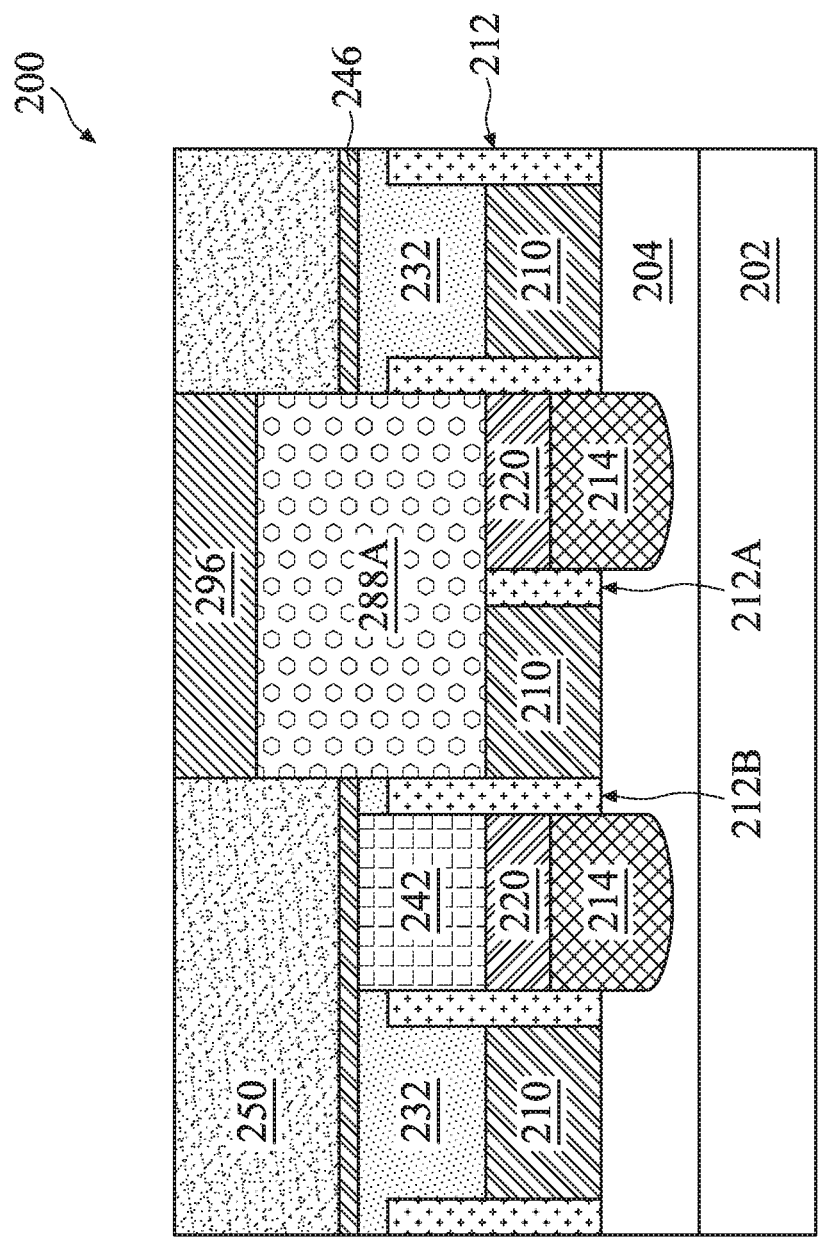
Figure 16C:
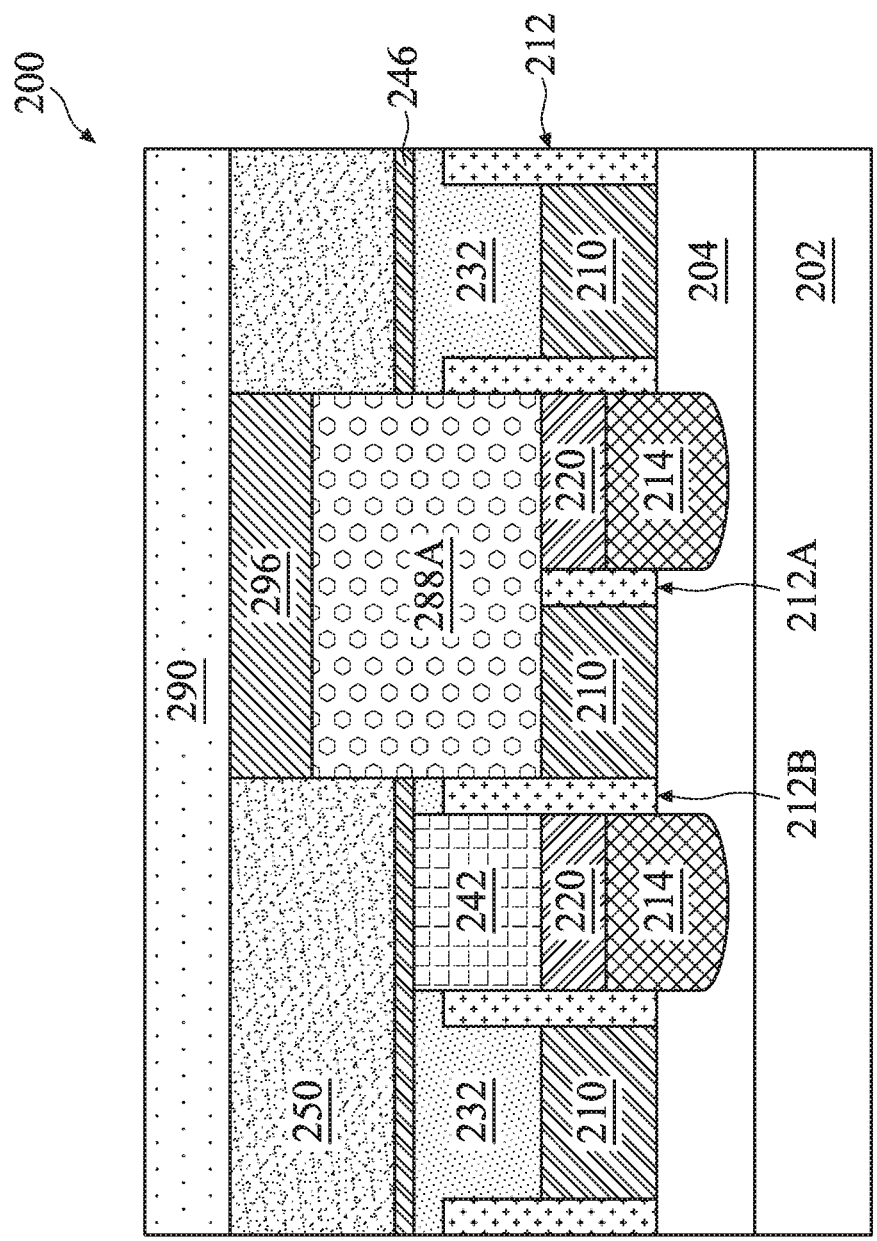
Figure 16D:
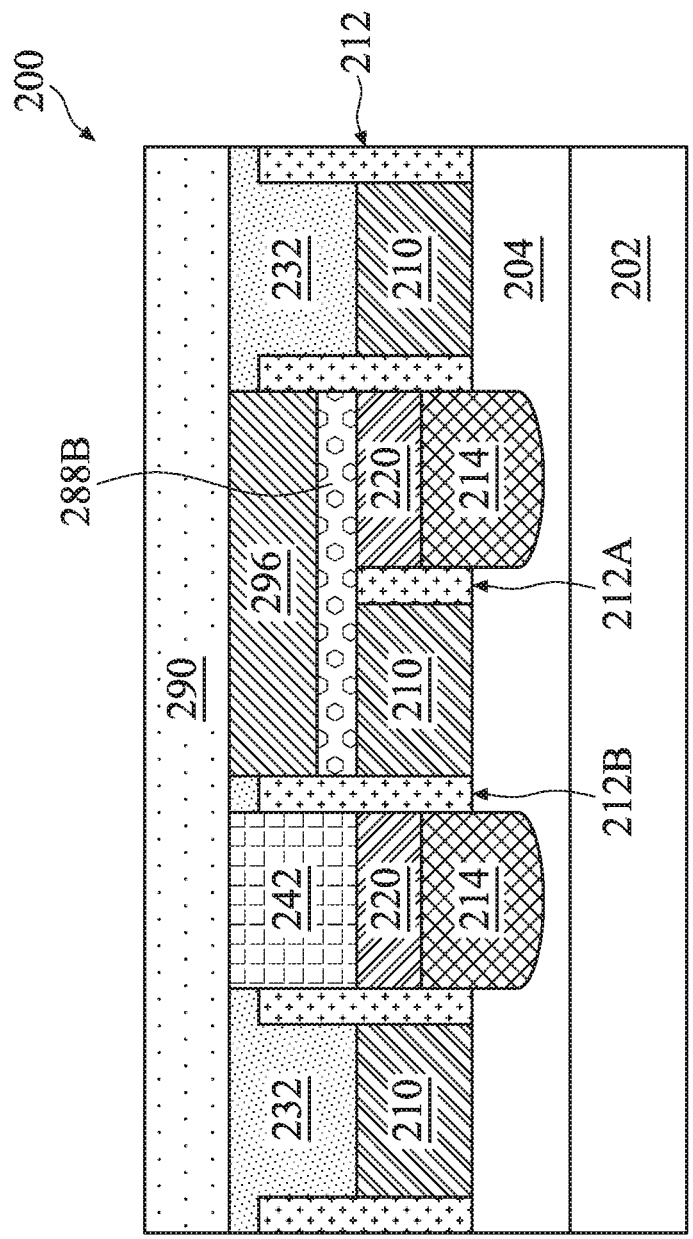
Figure 16E:
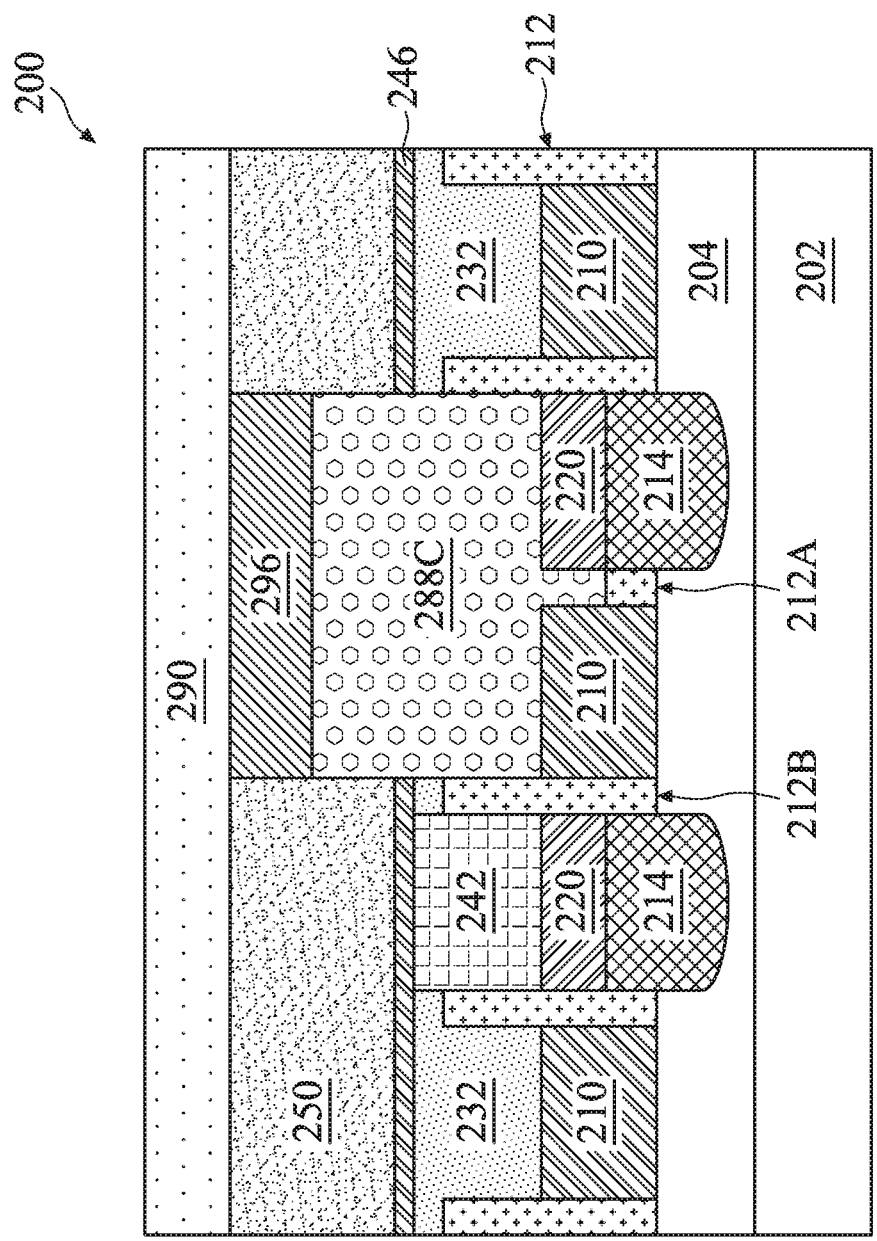
Figure 16F:
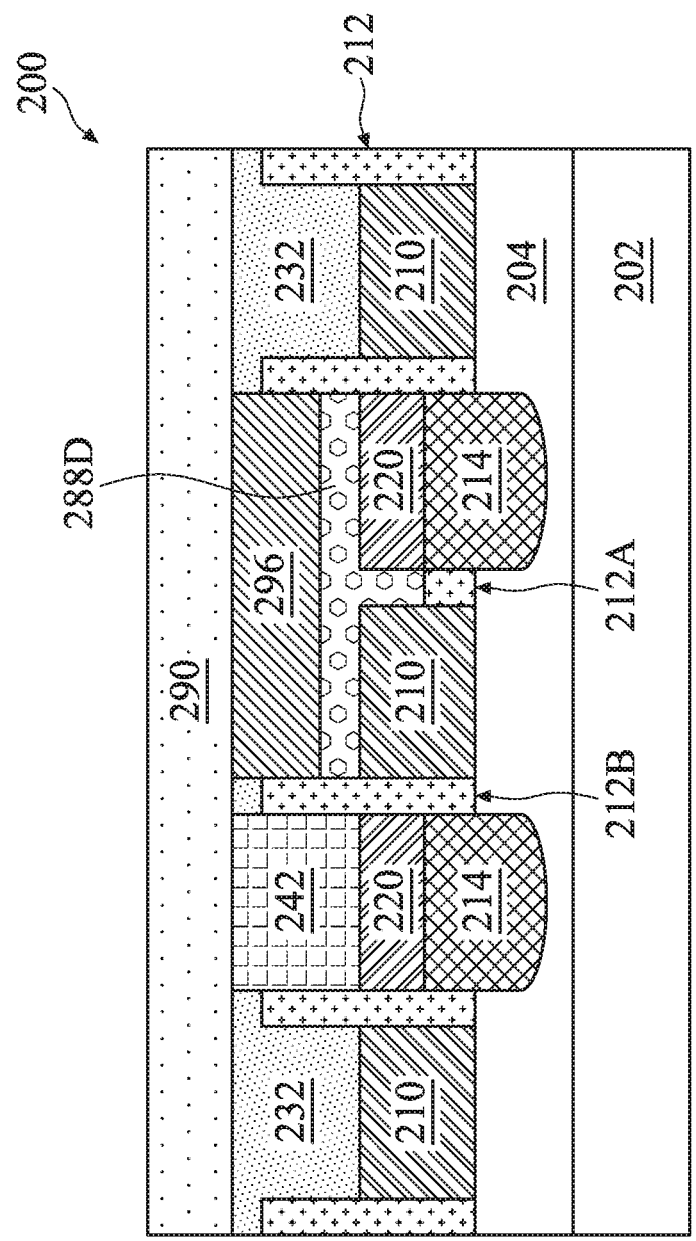
Figure 16G:
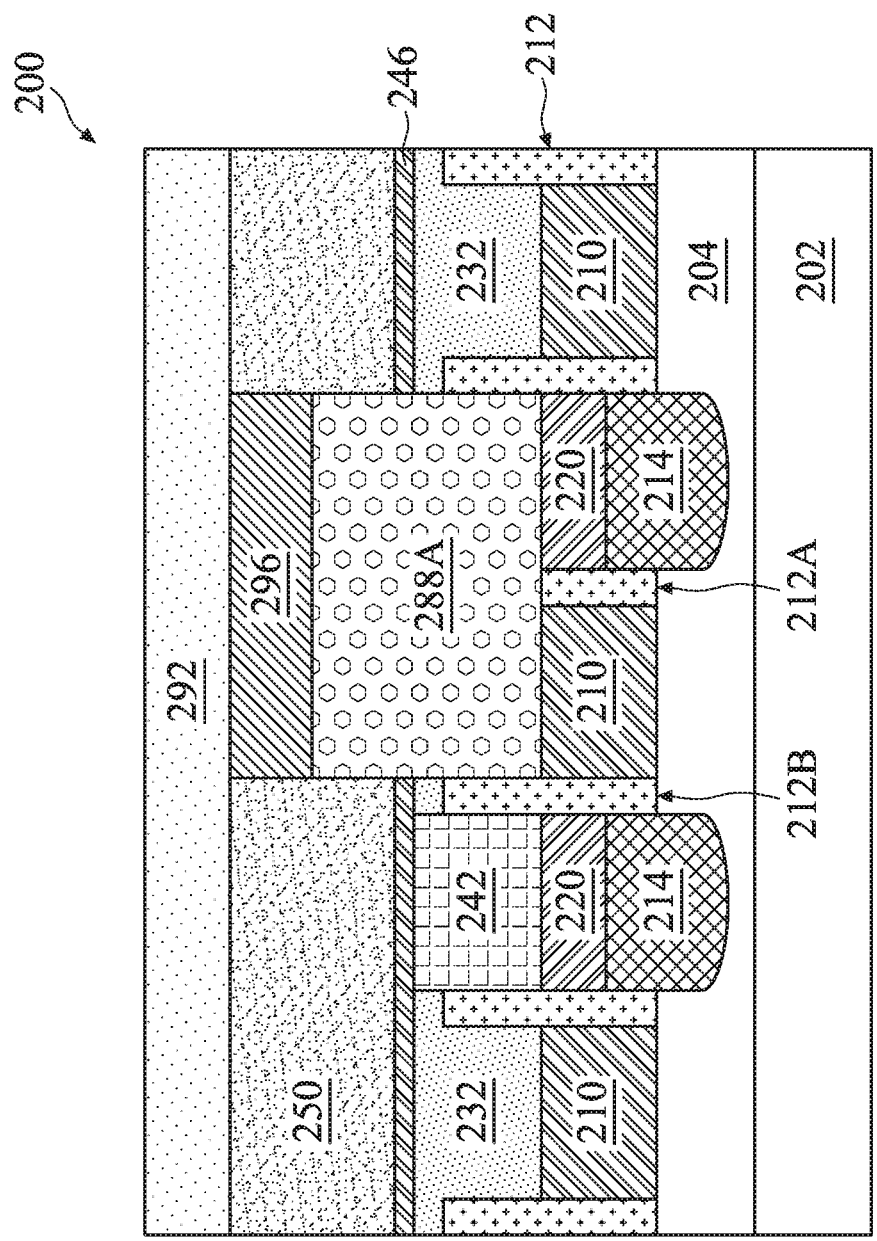
Figure 17A:
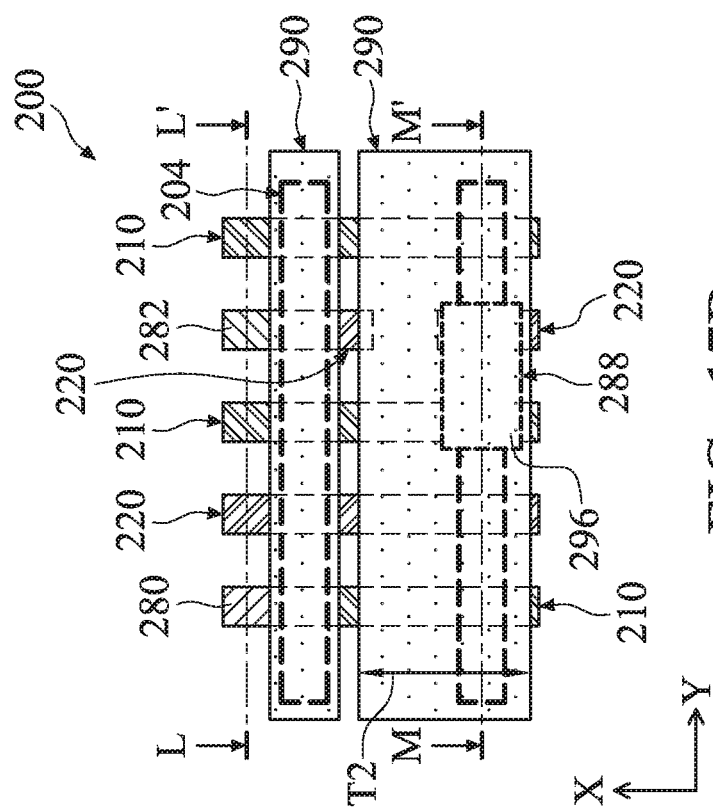
FIG. 17A is a planar top view of an embodiment of the semiconductor device of FIGS. 13G, 14B, 15C, and/or 15D, according to various aspects of the present disclosure.
Figure 17B:
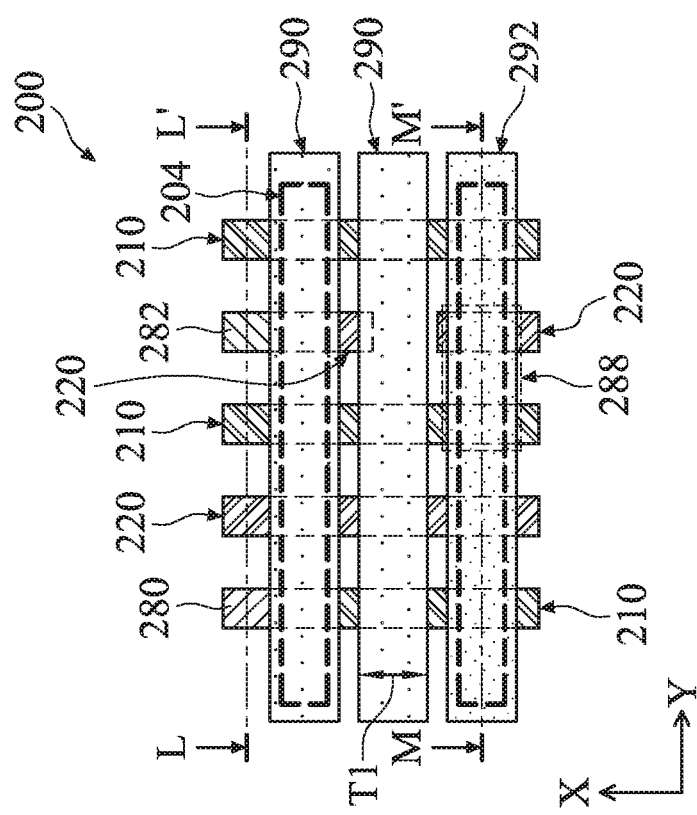
FIG. 17B is a planar top view of an embodiment of the semiconductor device of FIGS. 16C, 16D, 16E, and/or 16F, according to various aspects of the present disclosure.

Referring to FIG. 16B, the method 100 deposits a dielectric layer 296 in the trench 279 and subsequently planarizes it in one or more CMP processes, such that a top surface of the dielectric layer 296 is substantially planar with the top surface of the ILD layer 250. The dielectric layer 296 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, other suitable materials, or combinations thereof. In some embodiments, composition of the dielectric layer 296 is different from that of the neighboring dielectric components, including the ILD layer 250. Subsequently, referring to FIG. 16C, the method 100 forms the interconnect feature 290 over the device 200 in a process similar to that discussed above with respect to operation 114.

As depicted in FIGS. 16C, 16D, 16E, and 16F, the dielectric layer 296 may be formed over any suitable embodiments which correspond to various configurations of the BCT discussed above in reference to FIGS. 13G, 14B, 15C, and 15D, respectively. Notably, without the presence of the dielectric layer 296, the interconnect feature 290 must be electrically isolated from the BCT 288A, 288B, 288C, and 288D by the dielectric layer 292. In other words, comparing FIG. 17A, which depicts a planar top view of the device 200 depicted in FIG. 13G, 14B, 15C, or 15D, with FIG. 17B, which depicts a planar top view of the device 200 depicted in FIG. 16C, 16D, 16E, or 16F, the presence of the dielectric layer 296 allows the interconnect feature 290 to expand in width from T1 to T2, thereby lowering the contact resistance of the interconnect feature 290. In this regard, the dielectric layer 296 in effect "buries" the BCT (e.g., the BCT 288A) and therefore allows greater design flexibility with respect to the types of components that can be formed over the BCT without causing shorting concerns. In some embodiments, comparing FIG. 16G with FIG. 16C, the dielectric layer 292, rather than the interconnect feature 290, is formed over the dielectric layer 296. Of course, while not depicted, the dielectric layer 292 may be formed in place of the interconnect feature 290 in other configurations of the device 200 as well, such as those depicted in FIGS. 16D, 16E, and/or 16F.

In the present disclosure, Pathway A and Pathway B may be implemented concurrently or sequentially, as no specific order is required for the purposes of the present disclosure. For example, the trenches 270 and 272, the opening 276, and/or the trench 279 may be formed by the same series of patterning processes (e.g., using the same photomask during exposure), be filled by the same deposition process with the same conductive material (e.g., the conductive material 280 or the conductive material 286), and/or be planarized by the same CMP process(es) either along line AA' (i.e., at the top surface of the ILD layer 250) or along line BB' (i.e., at the top surface of the dielectric layers 232 and 242) as discussed in detail above.

Although not intended to be limiting, one or more embodiments of the present disclosure provide many benefits to a semiconductor device and the formation thereof. For example, embodiments of the present disclosure provide an improved structure of a butted contact, and a method of fabricating the same, configured to electrically couple a gate structure to an S/D contact. In some embodiments, such a method includes removing at least a portion of a gate spacer disposed between the gate structure and the S/D contact, resulting in better contact between the butted contact, the gate structure, and the S/D contact. In some embodiments, the gate spacer is etched such that a bottom portion of the butted contact extends to contact sidewalls of the gate structure and the S/D contact, thereby further enlarging a contact area between the butted contact, the gate structure, and the S/D contact. Removing at least a portion of the gate spacer may allow reduction in a height of the butted contact, and thus reduction in contact resistance thereof, to be achieved by a CMP process without compromising the function of the butted contact. In addition, embodiments of the present disclosure also provide etching back a portion of the butted contact and forming a dielectric layer over the etched butted contact to electrically isolate the butted contact from conductive components subsequently formed thereover. The presence of such a dielectric layer allows an interconnect feature (e.g., a conductive line) to be formed directly over the butted contact, thereby enlarging the width and reducing the contact resistance of the interconnect.

In one aspect, the present disclosure provides a semiconductor structure that includes a metal gate structure (MG) formed over a substrate, a first gate spacer formed on a first sidewall of the MG, a second gate spacer formed on a second sidewall of the MG opposite to the first sidewall, where the second gate spacer is shorter than the first gate spacer, an S/D contact (MD) adjacent to the MG, where a sidewall of the MD is defined by the second gate spacer, and a contact feature configured to electrically connect the MG to the MD.

In another aspect, the present disclosure provides a semiconductor structure that includes an MG formed over a substrate, a S/D feature adjacent to the MG, an MD contacting the S/D feature, and a conductive feature configured to contact both the MG and the MD, where a bottom portion of the conductive feature is embedded between a sidewall of the MG and a sidewall of the MD.

In yet another aspect, the present disclosure provides a method that includes first forming a semiconductor device having a MG formed over a semiconductor layer, a gate spacer formed on a sidewall of the MG, and an S/D feature formed in the semiconductor layer and adjacent to the MG. The method further includes forming an MD over the S/D feature, where the gate spacer separates the MD from the MG, forming an ILD layer over the MG and the MD, and forming an opening to expose the MG, the MD, and the gate spacer. The method subsequently includes removing a top portion of the gate spacer exposed in the opening, forming a metal layer over a remaining portion of the gate spacer, and planarizing the metal layer to form a contact feature, such that the contact feature electrically contacts both the MG and the MD.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a metal gate structure (MG) disposed over a semiconductor substrate;
    a source/drain (S/D) feature disposed adjacent to the MG;
    a first gate spacer disposed on a first sidewall of the MG;
    a second gate spacer disposed on a second sidewall of the MG opposite to the first sidewall, wherein the second gate spacer is shorter than the first gate spacer;
    an S/D contact (MD) disposed over the S/D feature and adjacent to the MG, wherein a sidewall of the MD is defined by the second gate spacer; and
    a contact feature configured to electrically connect the MG to the MD, wherein the contact feature includes a portion disposed over a top surface of the S/D feature, and wherein the contact feature is in direct physical contact with the MD, the first gate spacer and the second gate spacer.

2. The semiconductor structure of claim 1, wherein a top surface of the second gate spacer is below a top surface of the MG.

3. The semiconductor structure of claim 1, wherein a sidewall of the contact feature is aligned with the first gate spacer.

4. The semiconductor structure of claim 1, further comprising an interlayer dielectric (ILD) layer disposed over the MG, wherein a top portion of the contact feature is disposed in the ILD layer.

5. The semiconductor structure of claim 4, further comprising a conductive layer disposed over the ILD layer and a dielectric layer disposed in the ILD layer, wherein sidewalls of the dielectric layer are continuous with sidewalls of the contact feature.

6. The semiconductor structure of claim 1, wherein MG has a first edge facing the S/D contact and the S/D contact has a second edge facing the MG, and
    wherein the contact feature is in direct physical contact with eh first edge of the MG and the second edge of the S/D contact.

7. A semiconductor structure, comprising:
    a metal gate structure (MG) disposed over a semiconductor substrate;
    a source/drain (S/D) feature disposed adjacent to the MG along a direction;
    a S/D contact (MD) disposed on the S/D feature; and
    a conductive feature configured to contact both the MG and the MD, wherein a bottom portion of the conductive feature is directly sandwiched between a sidewall of the MG and a sidewall of the MD along the direction.

8. The semiconductor structure of claim 7, further comprising a gate spacer disposed between the sidewall of the MG and the sidewall of the MD, such that the bottom portion of the conductive feature contacts a top surface of the gate spacer.

9. The semiconductor structure of claim 7, wherein the conductive feature is a first conductive feature, the semiconductor structure further comprising a second conductive feature, wherein the second conductive feature is separated from the first conductive feature by a dielectric layer, and wherein sidewalls of the dielectric layer are continuous with sidewalls of the first conductive feature.

10. The semiconductor structure of claim 9, further comprising an interlayer dielectric (ILD) layer disposed between the MG and the second conductive feature, wherein the sidewalls of the dielectric layer are defined by the ILD layer.

11. The semiconductor structure of claim 7, further comprising an interlayer dielectric (ILD) layer disposed over the MG and a dielectric layer disposed over the ILD layer, wherein the conductive feature extends through the ILD layer to contact the dielectric layer.

12. A semiconductor structure, comprising:
    a first metal gate structure (MG) and a second MG disposed over a semiconductor substrate;
    a source/drain contact (MD) disposed between the first MG and the second MG along a direction;
    a first gate spacer disposed along a first sidewall of the first MG and separating the first MG from the MD;
    a second gate spacer disposed along a second sidewall of the first MG;
    a third gate spacer disposed along a sidewall of the second MG; and
    a contact feature disposed over the first gate spacer to electrically couple the first MG to the MD, wherein at least a lower portion of the contact feature is in direct physical contact with a sidewall of the second gate spacer and a sidewall of the third gate spacer.

13. The semiconductor structure of claim 12, wherein the second gate spacer extends above the first gate spacer.

14. The semiconductor structure of claim 12, wherein a top surface of the contact feature is above a top surface of the second gate spacer.

15. The semiconductor structure of claim 12, wherein a top surface of the contact feature is below a top surface of the second gate spacer.

16. The semiconductor structure of claim 13, further comprising a dielectric layer disposed over the contact feature, wherein at least a lower portion of the dielectric layer extends continuously from the second gate spacer to the third gate spacer.

17. The semiconductor structure of claim 16, further comprising:
    an interconnect feature continuously spanning over the second gate spacer, the first MG, the MD, the first gate spacer, the third gate spacer, and the second MG, wherein a bottom surface of the interconnect feature is spaced apart from a top surface of the contact feature by the dielectric layer.

18. The semiconductor structure of claim 16, wherein the dielectric layer directly contacts a top surface of the contact feature.

19. The semiconductor structure of claim 12, further comprising an interlayer dielectric (ILD) layer disposed over the first MG and the MD, wherein a top portion of the contact feature is disposed in the ILD layer.

20. The semiconductor structure of claim 8, wherein the gate spacer is a first gate spacer, the semiconductor structure further comprising a second gate spacer opposite the first gate spacer, wherein the second gate spacer extends higher than the first gate spacer.

* * * * *